(12) United States Patent
Noguchi

(10) Patent No.: US 7,538,920 B2
(45) Date of Patent: May 26, 2009

(54) HOLOGRAM REPRODUCTION APPARATUS AND HOLOGRAM REPRODUCTION METHOD

(75) Inventor: Tatsumi Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 11/500,939

(22) Filed: Aug. 9, 2006

(65) Prior Publication Data

US 2007/0047041 A1 Mar. 1, 2007

(30) Foreign Application Priority Data

Aug. 30, 2005 (JP) ............................. 2005-249086

(51) Int. Cl.
G03H 1/22 (2006.01)
G03H 1/04 (2006.01)
G11B 19/00 (2006.01)

(52) U.S. Cl. .................... 359/32; 359/35; 369/47.36

(58) Field of Classification Search .................... 359/24
See application file for complete search history.

(56) References Cited

U.S. PATENT DOCUMENTS 6,788,642 B2 * 9/2004 Hirotsune et al. ........ 369/275.3
2003/0090969 A1 * 5/2003 Matsumoto et al. ...... 369/44.34
2004/0196743 A1 * 10/2004 Teraoka et al. ........... 369/13.06
2004/0264323 A1 * 12/2004 Worthington et al. .... 369/47.27
2005/0254411 A1 * 11/2005 Kondo ..................... 369/275.1

FOREIGN PATENT DOCUMENTS

JP 2004022137 A * 1/2004

* cited by examiner

*Primary Examiner*—Arnel C Lavarias
*Assistant Examiner*—Jade Callaway
(74) *Attorney, Agent, or Firm*—Oblon, Spivak, McClelland, Maier & Neustadt, P.C.

(57) ABSTRACT

A reproduction apparatus is provided which reproduces, from a hologram recording medium on which digital data are recorded as an element hologram formed from interference fringes generated by interference of imaged data of the digital data as object light with reference light, the digital data. If a synchronization signal recorded in advance in a predetermined region of the hologram recording medium is detected successfully, then it is decided that the tracking state with regard to the element hologram is favorable. In this instance, signal processing is performed the image picked up from the element hologram to reproduce the digital data.

13 Claims, 31 Drawing Sheets

DATA DT

FOURIER IMAGE

DT REPRODUCTION IMAGE

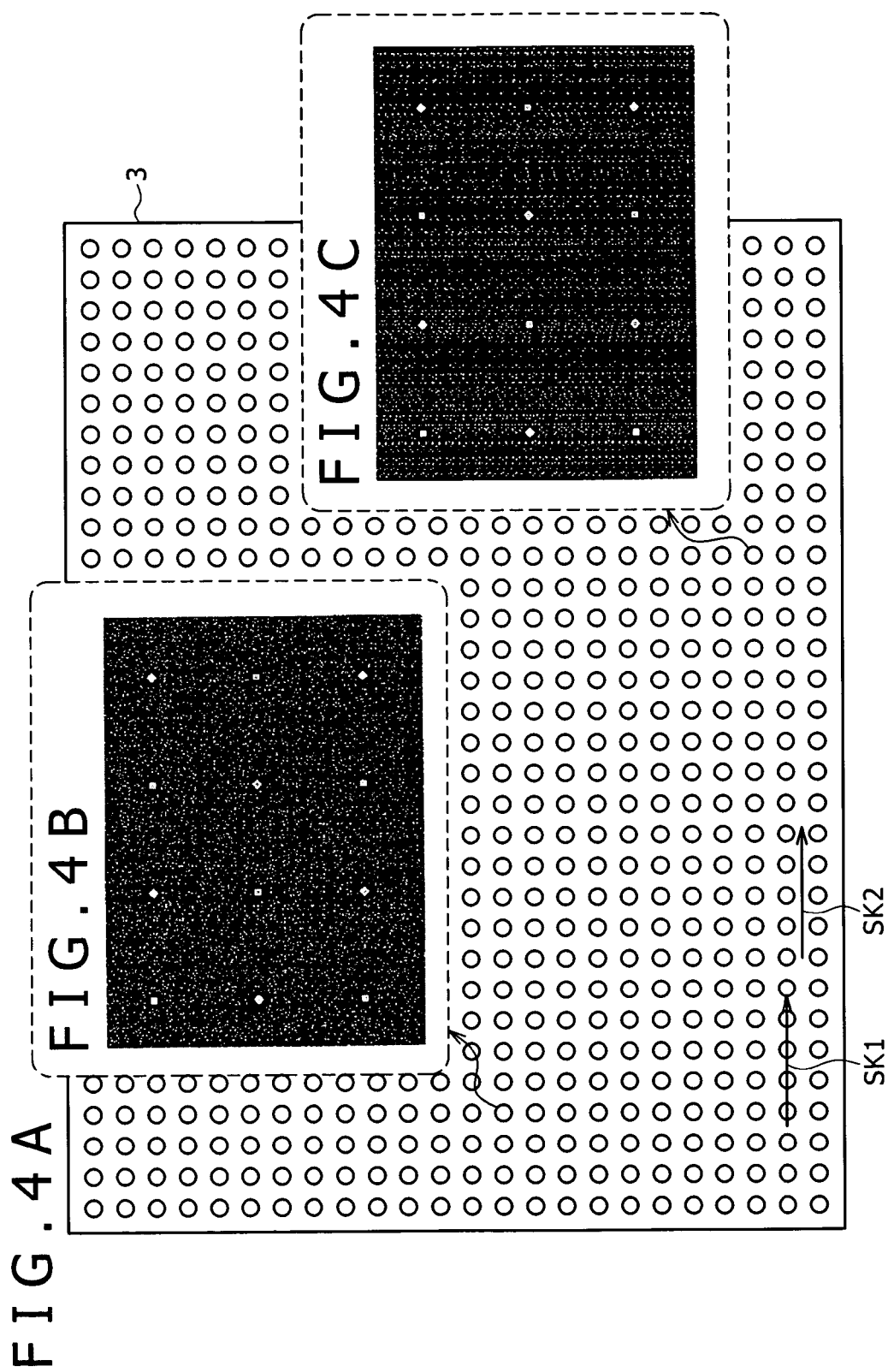

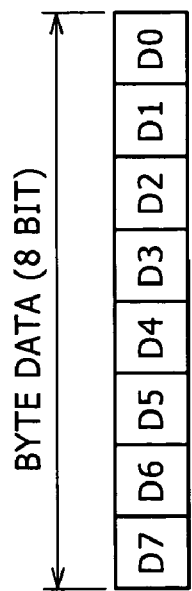

MAIN SYNC SYMBOL (ODD)

MAIN SYNC SYMBOL (EVEN)

EXAMPLE OF TWO-DIMENSIONAL SYNCHRONIZATION SIGNAL

EXAMPLE OF RANDOM PATTERN MODULATION

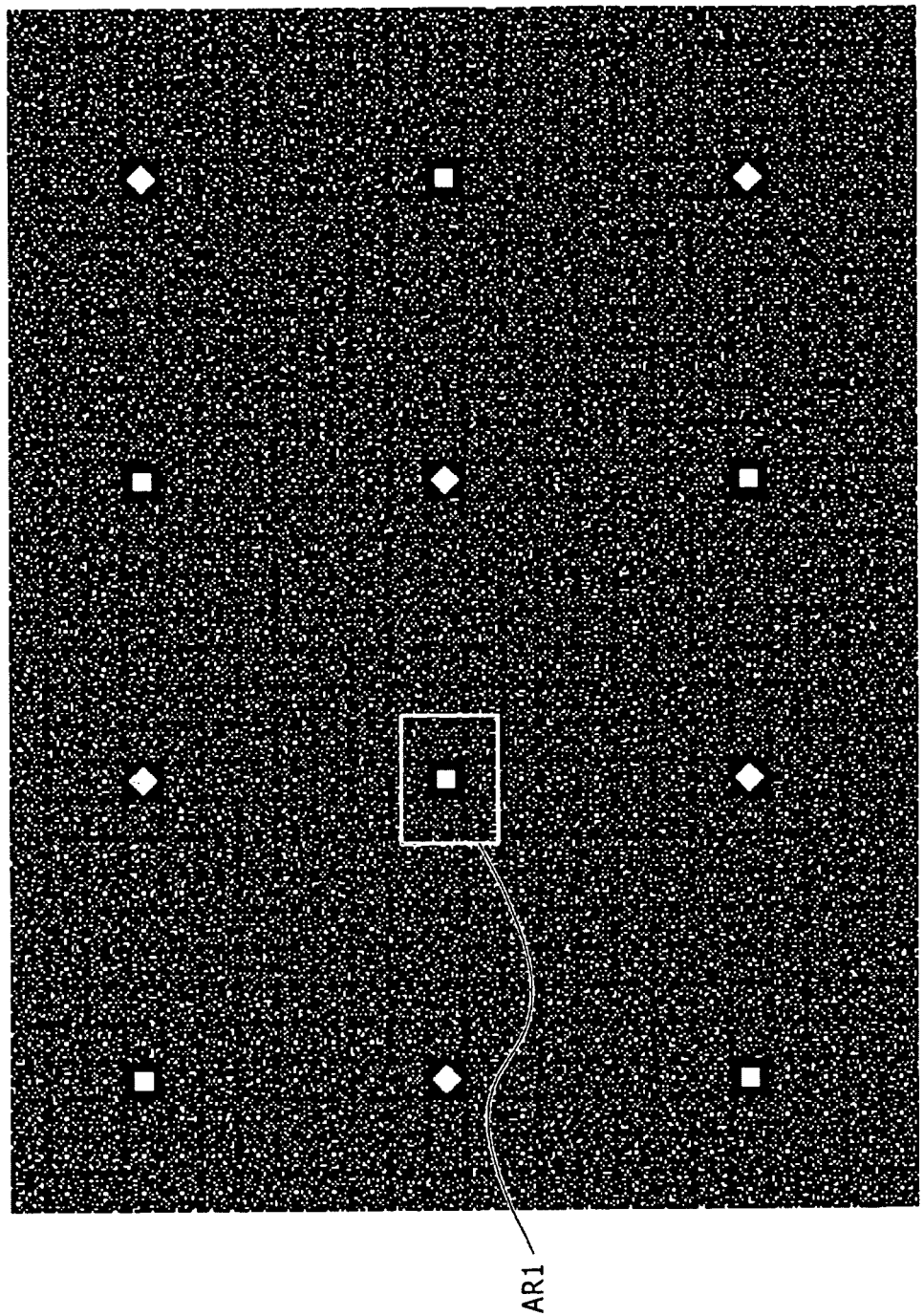
FIG.15  EXAMPLE OF MODULATION IMAGE
AR1

WHEN TRACKING IS GOOD

WHEN TRACKING IS NOT GOOD

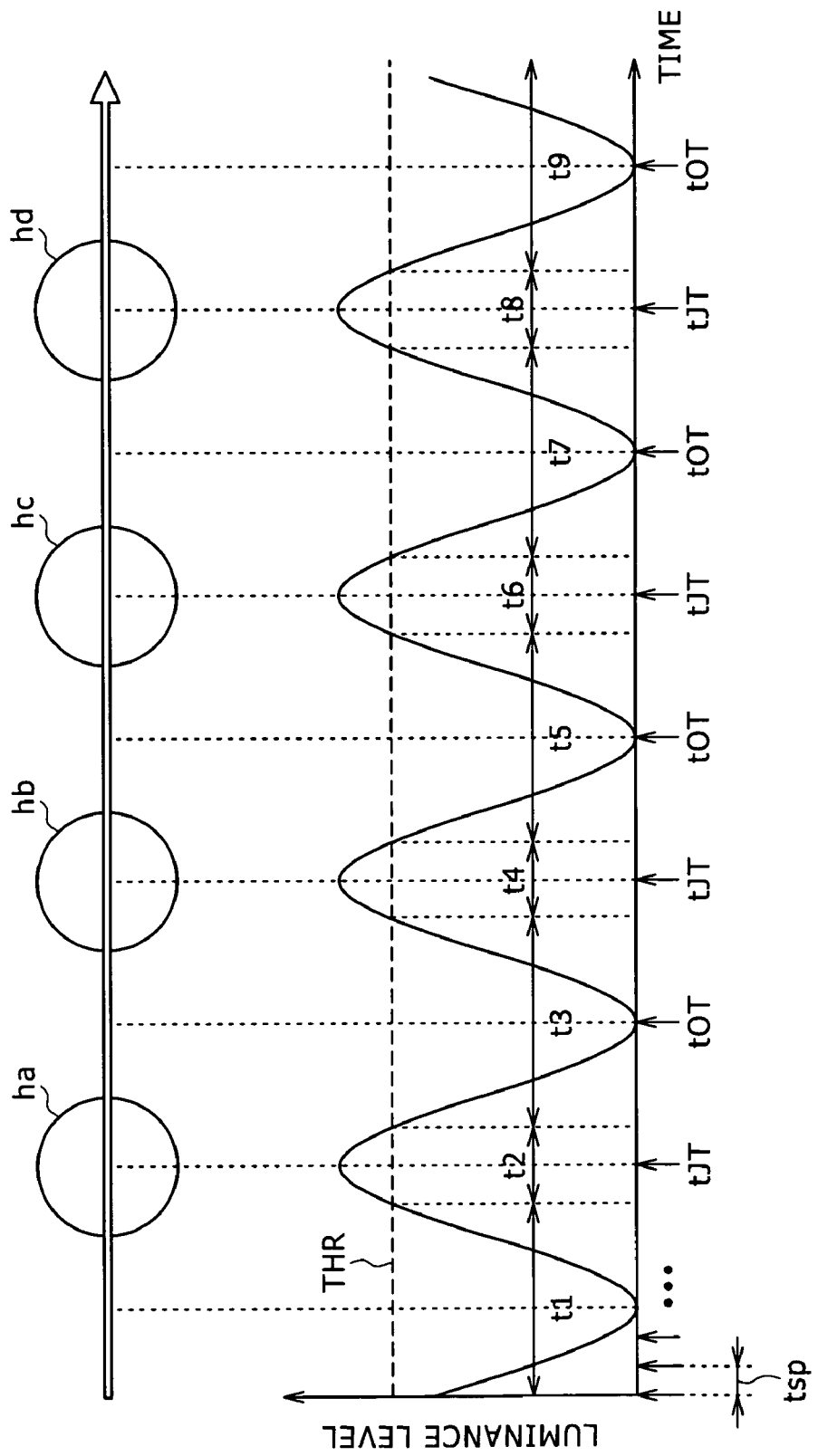

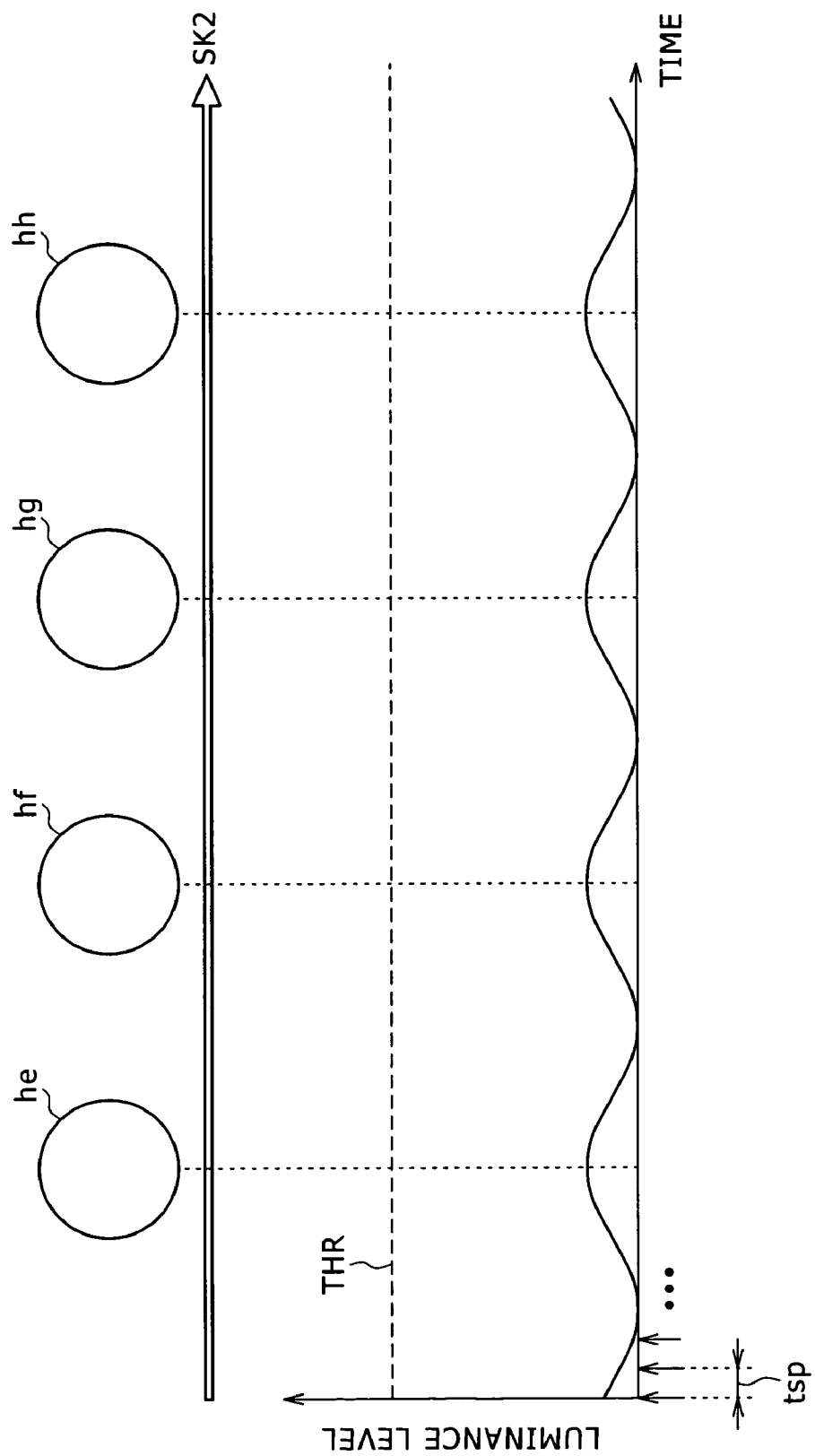

EXAMPLE OF RECORDING IMAGE

EXAMPLE OF REPRODUCTION IMAGE

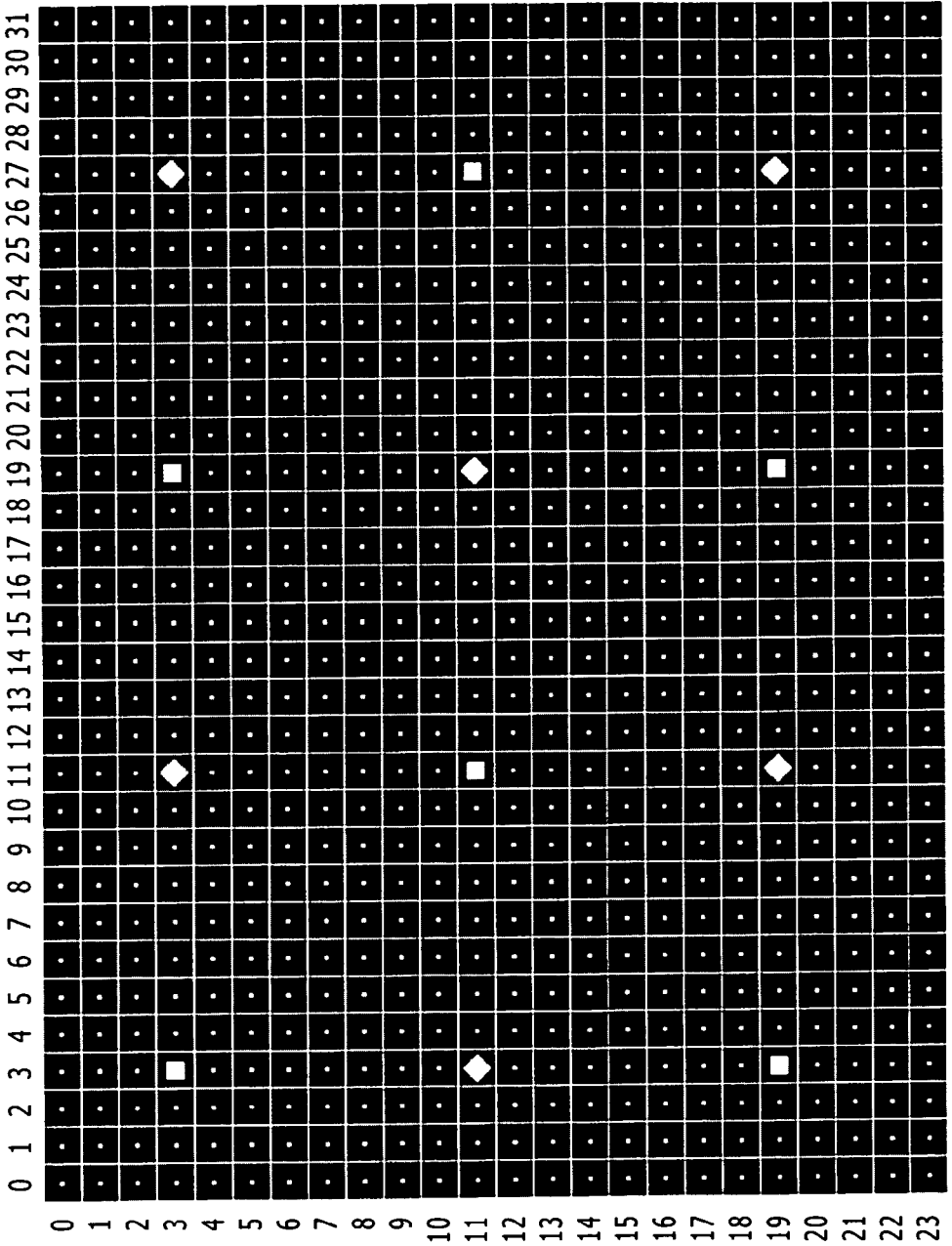
FIG.22 Group-SS BOUNDARY AS VIEWED WITH SYNCHRONIZATION SIGNAL

GSS1 REPRODUCING IMAGE

GSS1 RECORDING IMAGE

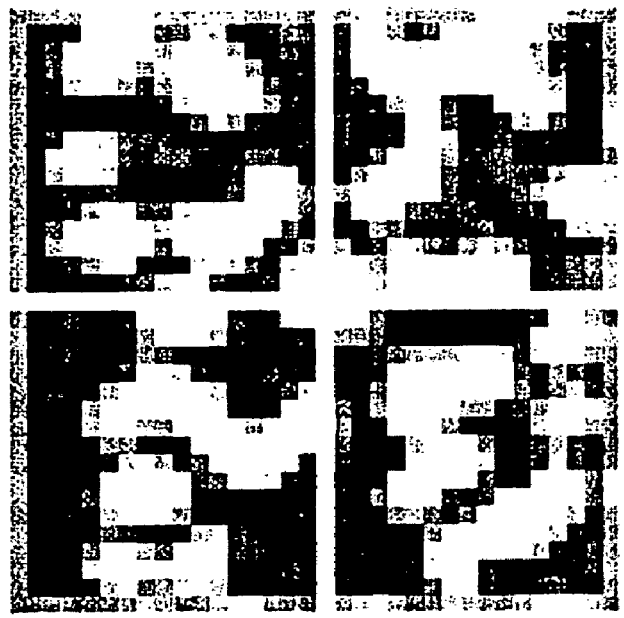
FIG. 27B   GSS1 REPRODUCING IMAGE
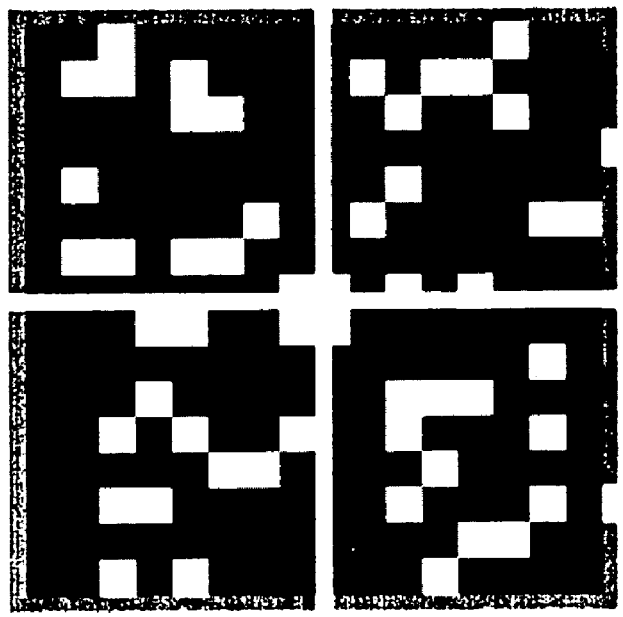
FIG. 27A   GSS1 RECORDING IMAGE

GSS1 REPRODUCING IMAGE

GSS1 RECORDING IMAGE

GSS1 REPRODUCING IMAGE

GSS1 RECORDING IMAGE

HOLOGRAM REPRODUCTION APPARATUS AND HOLOGRAM REPRODUCTION METHOD

CROSS REFERENCES TO RELATED APPLICATIONS

The present invention contains subject matter related to Japanese Patent Application JP 2005-249086, filed in the Japanese Patent Office on Aug. 30, 2005, the entire contents of which being incorporated herein by reference.

FIELD OF THE INVENTION

This invention relates to a hologram reproduction apparatus and a hologram reproduction method by which, from a hologram recording medium on which sound information such as voice, music or the like, image information such as a still picture, a moving picture or the like, or data information such as a text file or the like is recorded as a two-dimensional image in the form of element holograms, the two-dimensional image is read out and information is reproduced from the read two-dimensional image.

BACKGROUND

Refer to Japanese Patent Laid-open No. 2005-173646.

As an example of information to be recorded on a recording medium in the form of a sheet, a one-dimensional code or a two-dimensional code represented by a bar code, a QR code, a dot code and so forth are available. However, in information recording media on which such codes are recorded, the amount of information which can be recorded per unit area is as small as approximately several tens to several kilo bites. This is because there is a physical limit to a recording resolution of density printing of a mere image.

Further, as another recording medium in the form of a sheet, also a hologram recording medium is known on which various data are recorded in the form of interference fringes using object light and reference light. Also it is known that the hologram recording medium can increase the recording density significantly thereby to allow remarkable increase of the recording capacity. Thus, it is considered that the hologram recording medium is suitable for use, for example, as a great capacity storage medium for computer data, AV (Audio-Visual) content data and so forth.

In order to record data on the hologram recording medium, the data are imaged as two-dimensional page data. Then, the imaged data are displayed on a liquid crystal display panel or the like, and light transmitted through the liquid crystal display panel is irradiated as object light, that is, object light which is to form an image of the two-dimensional page data, on the hologram recording medium. Further, reference light is irradiated on the hologram recording medium from a predetermined angle. At this time, interference fringes generated by the object light and reference light are recorded as one element hologram in the form of dots, rectangles or the like. In other words, one element hologram has data of one two-dimensional page recorded thereon.

SUMMARY

Incidentally, a hologram memory typically having a sheet-like shape is considered. Further, a system is considered wherein computer data, AV content data or some other data are recorded on the hologram memory and a common user can use a reproduction apparatus as a hologram reader to acquire the data recorded on the hologram memory.

A hologram memory having a sheet-like shape is a recording medium wherein a large number of element holograms are recorded in a spread manner over a plane as the surface of the medium. A hologram reader is disposed in an opposing relationship to the surface of the recording medium such that it reads data recorded as the element holograms on the surface of the recording medium.

Where a hologram technique is applied, the amount of information which can be recorded per unit area can be increased remarkably when compared with ordinary printing. However, with a known reproduction system used for a bar code system or a QR code system, it is difficult in principle to read out high-density data recorded on a hologram memory.

Therefore, it is desirable to provide a reproduction apparatus and a reproduction method by which information can be reproduced suitably from a hologram recording medium. Particularly, it is desirable to provide a reproduction apparatus and a reproduction method by which a large amount of information recorded on a medium in the form of a sheet on which the information is recorded as holograms by printing can be reproduced.

According to an embodiment of the present invention, there is provided a reproduction apparatus capable of reproducing, from a hologram recording medium on which digital data are recorded as an element hologram formed from interference fringes generated by interference of imaged data of the digital data as object light with reference light, the digital data, including image pickup means for picking up an image of the element hologram as a two-dimensional image; storage means for storing the two-dimensional image picked up by the image pickup means; partial extraction means for extracting a predetermined region of the two-dimensional image picked up by the image pickup means; decision means for decide a tracking state with regard to the element hologram from the two-dimensional image extracted by the partial extraction means; image fetching processing means fetching, where it is decided by the decision means that the two-dimensional image picked up by the image pickup means can be fetched, the two-dimensional image picked up by the image pickup means into the storage means; signal processing means for performing signal processing for the two-dimensional image stored in the storage means to reproduce the digital data; and control means for controlling the partial extraction means, decision means, image fetching means and signal processing means to extract the predetermined region from the two-dimensional image picked up by the image pickup means, decide the tracking state of the element hologram from the extracted two-dimensional image, fetch the two-dimensional image picked up by the image pickup means into the storage means based on the result of the decision and reproduce the digital data from the two-dimensional image stored in the storage means.

According to another embodiment of the present invention, there is provided a reproduction method for reproducing, from a hologram recording medium on which digital data are recorded as an element hologram formed from interference fringes generated by interference of imaged data of the digital data as object light with reference light, the digital data, including the steps of: picking up an image of the element hologram as a two-dimensional image; partially extracting a predetermined region of the picked up two-dimensional image; deciding a tracking state with regard to the element hologram from the extracted two-dimensional image; fetching the two-dimensional image into a memory where it is decided that the picked up two-dimensional image can be fetched; and performing signal processing for the two-dimensional image stored in the memory to reproduce the digital data.

According to a further embodiment of the present invention, there is provided a reproduction apparatus capable of reproducing, from a hologram recording medium on which digital data are recorded as an element hologram formed from interference fringes generated by interference of imaged data of the digital data as object light with reference light, the digital data, wherein an image of the element hologram is picked up as a two-dimensional image; a predetermined region of the picked up two-dimensional image is partially extracted; a tracking state of the two-dimensional image is decided from data recorded in the predetermined region of the partially extracted two-dimensional image; the picked up two-dimensional image of the element hologram is fetched into a memory where it is decided from the tracking state of the two-dimensional image that the two-dimensional image can be fetched; and signal processing is performed for the element hologram fetched in the memory to reproduce the digital data.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 4A is a schematic view showing the hologram memory and illustrating a two-dimensional image recorded on element holograms of the hologram memory;

FIG. 4B is an enlarged view showing a first element hologram and illustrating a two-dimensional image recorded on the element hologram;

FIG. 4C is a view showing a second element hologram and illustrating another two-dimensional image recorded on another element hologram;

FIG. 5A is a diagrammatic view showing a bit configuration of byte data of an object of two-dimensional code symbol modulation upon recording of an element hologram;

FIG. 5B is a diagrammatic view showing a pixel array after two-dimensional modulation and illustrating the two-dimensional modulation upon element hologram recording;

FIG. 5C is a diagrammatic view showing an example of byte data and illustrating the two-dimensional modulation upon element hologram recording;

FIG. 5D is a diagrammatic view showing an example of a pixel array after the two-dimensional modulation and illustrating the two-dimensional modulation upon element hologram recording;

FIG. 15 is a schematic view illustrating partial image pickup action of the hologram reader;

FIG. 17 is a diagrammatic view illustrating a relationship between the tracking state and the luminance level in the hologram reader;

FIG. 18 is a diagrammatic view illustrating another relationship between the tracking state and the luminance level in the hologram reader;

FIGS. 21 and 22 are views illustrating image division in a unit of a group sub sync of a recording image recorded on an element hologram of the hologram memory;

FIG. 27A is a diagrammatic view showing the example of the recording image recorded on the hologram memory;

FIG. 27B is a diagrammatic view showing the example of the reproduction image after main calculation by the hologram reader;

DESCRIPTION OF THE PREFERRED EMBODIMENTS

A preferred embodiment of the present invention is described in detail below in the following order.

1. Recording and Reproduction of the Hologram Memory
2. Recording Mode of the Hologram Memory
3. Configuration of the Hologram Reader
4. Reproduction Process
5. Effects of the Embodiment

1. Recording and Reproduction of the Hologram Memory

First, basic recording and reproduction action of a hologram memory 3 is described with reference to FIGS. 1A and 1B.

Figure 1A:
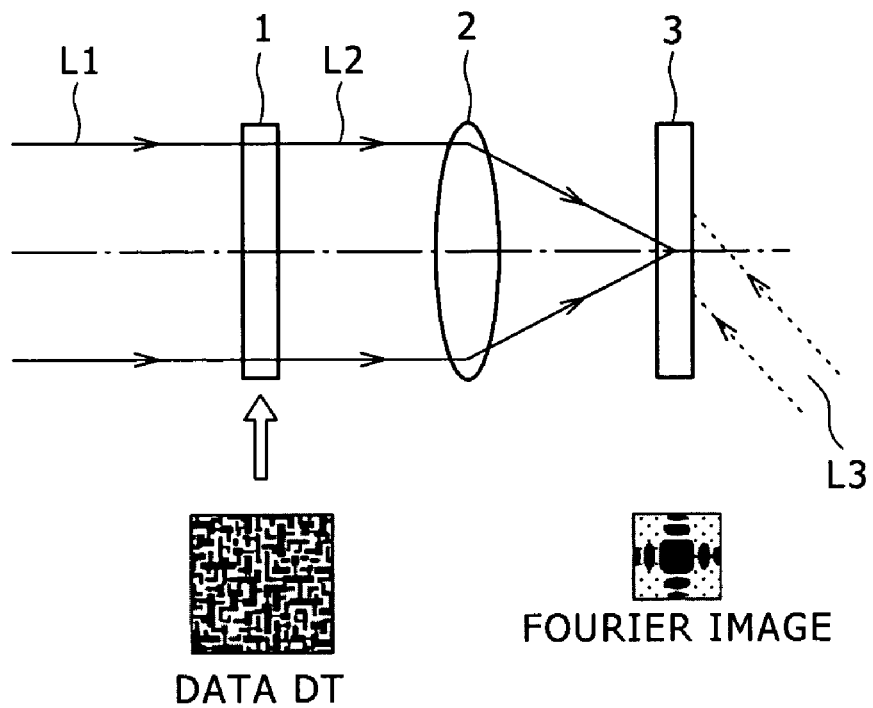
FIG. 1A is a schematic view illustrating recording on a hologram memory.

FIG. 1A illustrates a manner of data recording on the hologram memory 3. In order to record content data or data as a computer program or the like on the hologram memory 3, the entire recording data are encoded into a large number of data for one page.

One data DT as a unit of the encoded data is converted, for example, into such image data of a two-dimensional barcode as shown in FIG. 1A and is displayed as a two-dimensional page data image on a liquid crystal panel 1.

Laser light L1 outputted from a predetermined light source and typically converted into parallel light passes through the liquid crystal panel 1 on which the two-dimensional page data image is displayed. Thereupon, the laser light L1 is converted into object light L2 of an image representative of the two-dimensional data image.

The object light L2 is condensed by a condenser lens 2 and focused as a spot on the hologram memory 3.

At this time, recording reference light L3 is irradiated at a predetermined angle upon the hologram memory 3. Consequently, the object light L2 and the recording reference light L3 interfere with each other to form interference fringes, which are recorded as a dot-shaped element hologram.

It is to be noted that, where the condenser lens 2 is used in this manner, the data recorded as an element hologram form a Fourier image of the image of the recording data by a Fourier transform action of the condenser lens 2.

One element hologram is recorded on the hologram memory 3 in this manner, and data DT of encoding units are successively converted into two-dimensional page data similarly and displayed on the liquid crystal panel 1. Consequently, the data DT are individually recorded as element holograms on the hologram memory 3.

Figure 3:
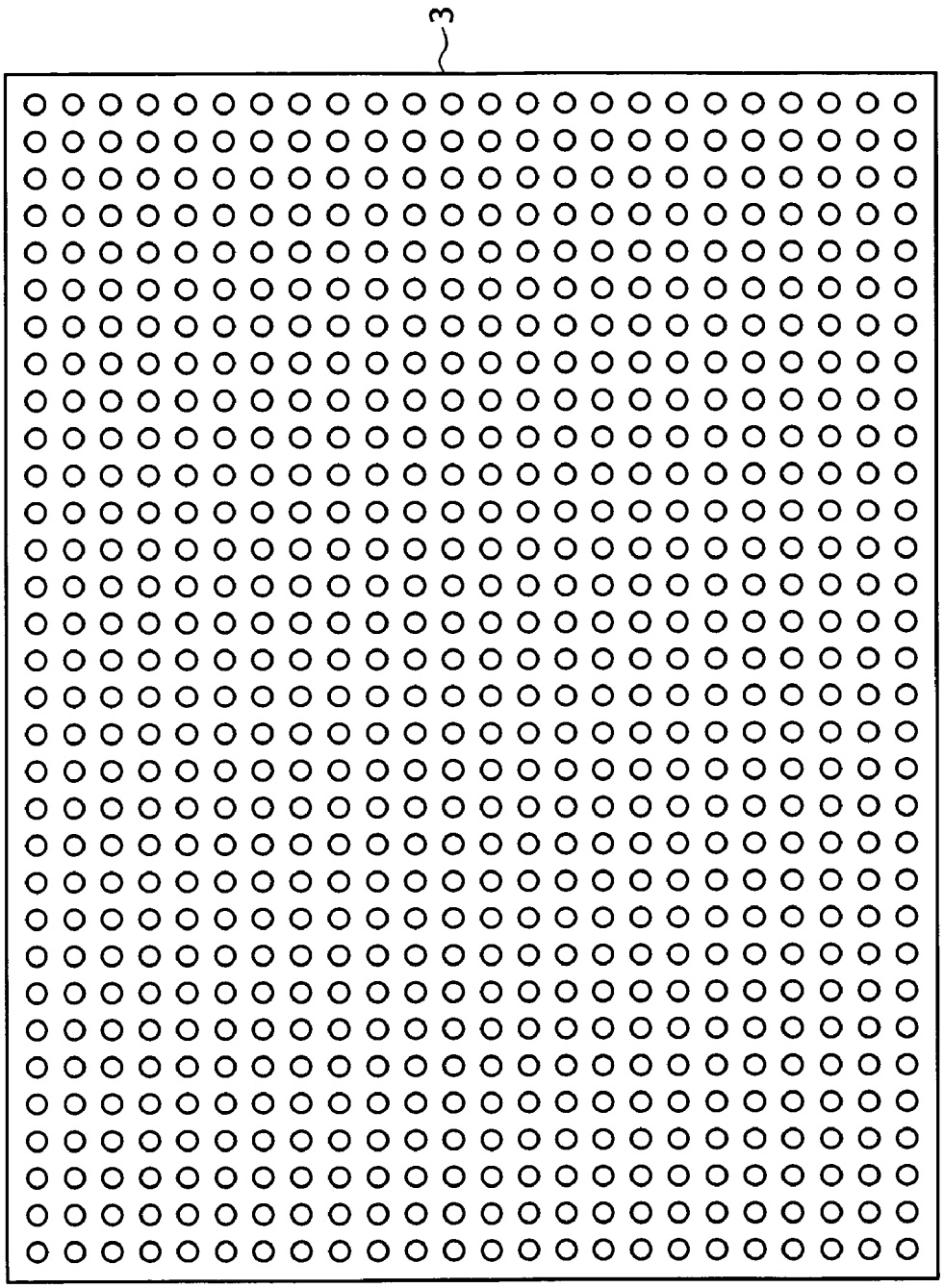
FIG. 3 is a view illustrating the hologram memory.

Upon recording of each element hologram, the position of the hologram memory 3 (hologram material) is fed (or the recording optical system is fed) by a feeding mechanism not shown to successively displace the recording position of the element hologram a little on the plane of the hologram memory 3. Consequently, a large number of elementary holograms are recorded on the hologram memory 3 typically in the form of a sheet so as to be disposed in a direction of the plane of the hologram memory 3. Referring to FIG. 3, one element hologram is represented by a mark "o", and a large number of such element holograms are formed as seen in FIG. 3.

Figure 1B:
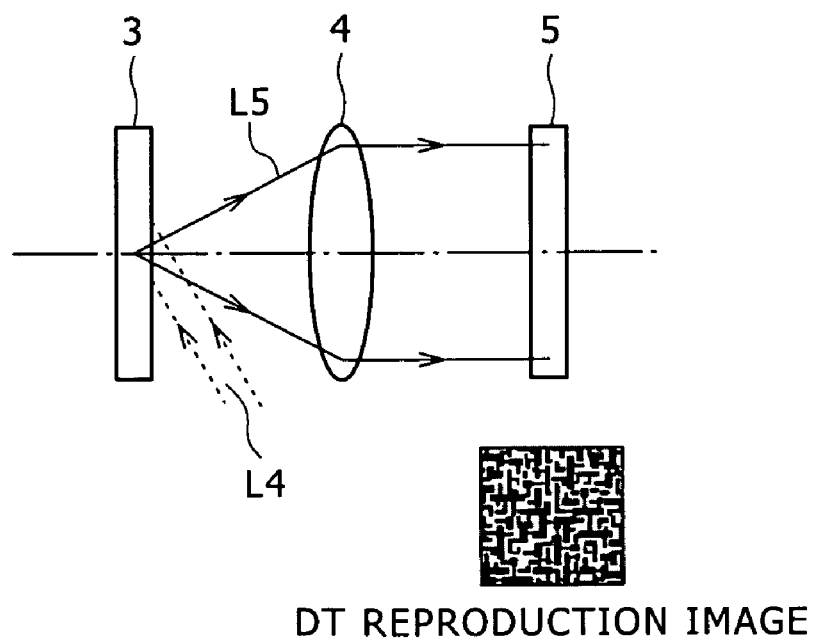
FIG. 1B is a schematic view illustrating reproduction from the hologram memory.

The hologram memory 3 on which element holograms are recorded in this manner are reproduced in such a manner as seen in FIG. 1B. Referring to FIG. 1B, a collimator lens 4 and an imager 5 are provided in a reproduction apparatus as a hologram reader not shown.

Reproduction reference light L4 is irradiated at an irradiation angle same as that upon recording on the hologram memory 3. By the irradiation of the reproduction reference light L4, the image recorded as the element holograms is obtained as a reproduction image. In other words, an image of the two-dimensional page data appears at a place conjugate with that of the liquid crystal panel 1 upon recording. The image is read by the imager 5.

In particular, reproduction image light L5 from the hologram memory 3 is converted into parallel light by the collimator lens 4 and enters the imager 5 which may be formed typically from a CCD image pickup element array or a CMOS image pickup element array. Since the Fourier image on the hologram memory 3 is inverse Fourier transformed into an image of two-dimensional page data by the collimator lens 4, a reproduction image as the two-dimensional page data is read by the imager 5.

The imager 5 generates a reproduction image signal in the form of an electric signal representative of the reproduction image. A decoding process is performed for the reproduction image signal to obtain original data, that is, the data prior to conversion into two-dimensional page data for recording.

Such data reading out is successively performed similarly for a large number of element holograms on the hologram memory 3 to obtain original content data or the like recorded on the hologram memory 3.

It is to be noted that angle multiplex recording is known as a recording method for such a hologram memory 3 as described above. The angle multiplex recording is a method of multiplex recording element holograms at the same position on a plane by varying the angle of the recording reference light L3.

For example, if an element hologram is recorded in such a manner as seen in FIG. 1A and then the irradiation angle of the recording reference light L3 is varied, then another element hologram can be recorded at the same position on the plane of the hologram memory 3.

In other words, by varying the angle of the recording reference light L3, the plane of the hologram memory 3 can be used as multiple planes thereby to achieve multiplex recording, and the recording capacity can be increased significantly thereby. For example, a large number of such elementary hologram array planes as shown in FIG. 3 are formed.

Upon reproduction of the angle multiplex recorded hologram memory 3, the reproduction reference light L4 should be irradiated at angles same as the recording reference light angles upon recording. In particular, an element hologram recorded by irradiating the recording reference light L3 at a first angle can be read out by irradiating the reproduction reference light L4 at the same first angle. On the other hand, another element hologram recorded by irradiating the recording reference light L3 at a second angle can be read out by irradiating the reproduction reference light L4 at the same second angle.

Further, the hologram memory 3 on which data are recorded in the form of element holograms as described above can be duplicated readily in a mass by close contact copying.

Accordingly, the hologram memory 3 wherein element holograms are recorded on a hologram material as seen in FIG. 1A may be used as it is as a hologram memory to be provided to general users. However, the hologram memory 3 may otherwise be used for duplication of a large number of hologram memories by close contact copying.

For example, a system may be assumed wherein computer data, AV content data or some other data are recorded on hologram recording media and such hologram recording data are distributed widely such that a general user can acquire the data recorded on the hologram memory 3 using a reproduction apparatus such as a hologram reader 6. In this instance, it is preferable to generate a hologram master medium in such a manner as described hereinabove with reference to FIG. 1A and distribute a hologram memory duplicated from the master medium such that the data are read out through the operation described hereinabove with reference to FIG. 1B by the user side.

A hologram reader 6 as a reproduction apparatus according to the present embodiment hereinafter described performs scanning of the hologram memory 3 wherein reproduction reference light L4 is irradiated upon the hologram memory 3 to read element holograms on the hologram memory 3. For the scanning, manual scanning executed by a user and automatic scanning executed mechanically by the hologram reader 6 are available.

Figure 2A:
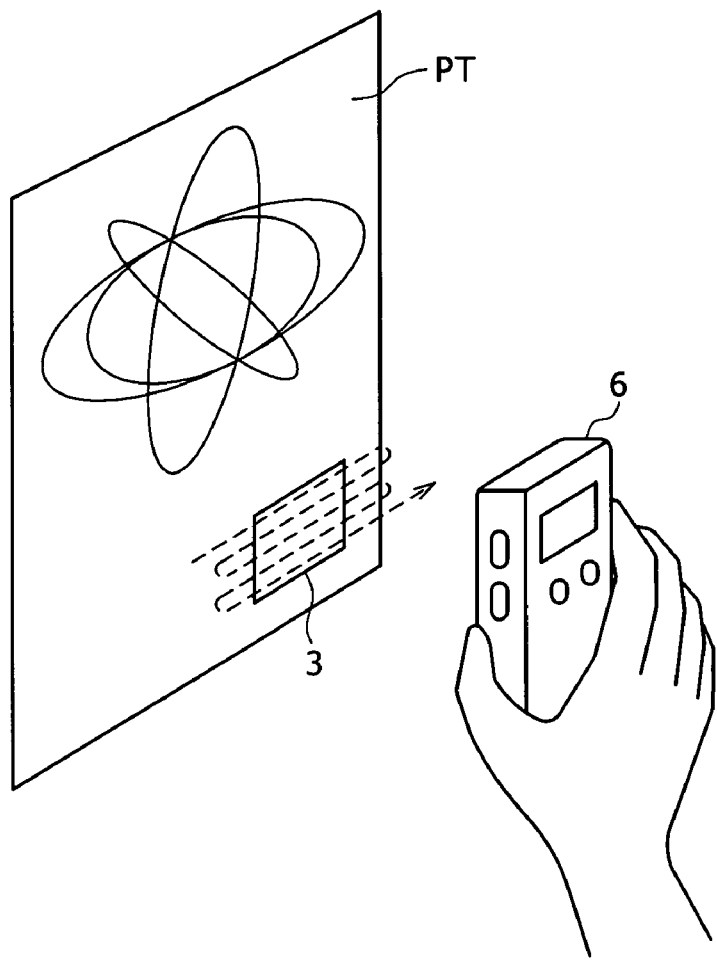
FIG. 2A is a schematic view illustrating an example of manual scanning operation of a hologram reader to which the present invention is applied.
Figure 2B:
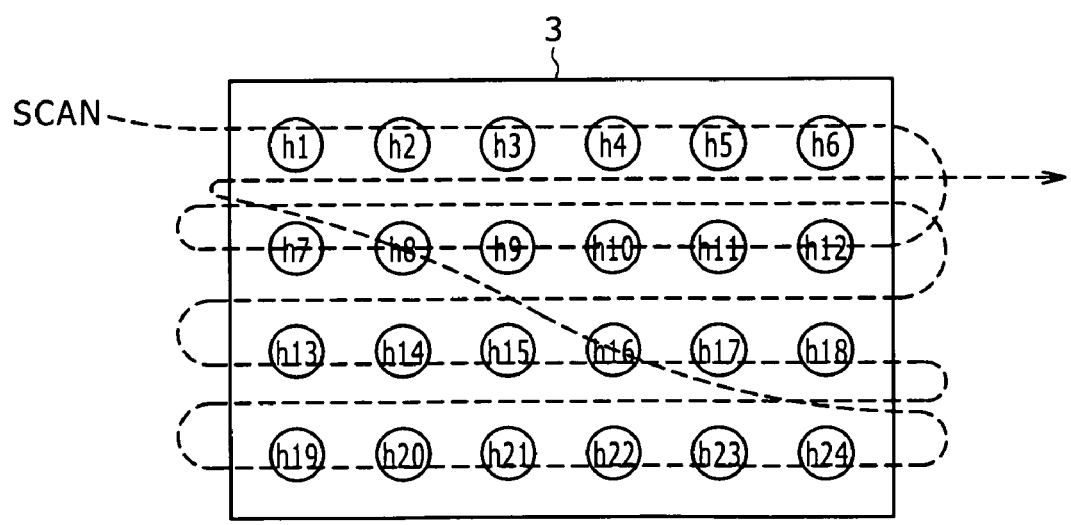
FIG. 2B is a schematic diagrammatic view illustrating an example of a scanning locus of the hologram reader upon manual scanning.

An example of the manual scanning method is illustrated in FIGS. 2A and 2B. In FIG. 2A, the hologram memory 3 on which data such as audio content data are recorded is shown adhered to a poster PT. The hologram reader 6 is formed as an apparatus which is so small and light that it can be grasped by a hand of the user. A light source for emitting such reproduction reference light L4 as described above and a lens system for fetching reproduction image light from the hologram memory 3 are formed on one face of a housing of the hologram reader 6.

The user would hold and operate the hologram reader 6 such that one face of the housing of the hologram reader 6 is positioned in the proximity of and in an opposing relationship to the hologram memory 3 and then swing the hologram reader 6 in an arbitrary direction. At this time, a reproduction image of element holograms on which the reproduction reference light L4 is successively irradiated at a predetermined angle is successively read by the hologram reader 6.

It is to be noted that, although it looks in FIG. 2A as if the hologram reader 6 were swung leftwardly or rightwardly by the user while the hologram reader 6 is spaced away from the hologram memory 3, also another scanning method may possibly be used. In particular, the hologram reader 6 may be swung upwardly, downwardly, leftwardly or rightwardly in a state whereon part of the housing of the hologram reader 6 is held in contact with the surface of the hologram memory 3, that is, in a sliding manner.

FIG. 2B schematically shows the hologram memory 3 on which a large number of element holograms h1 to h24 are recorded. If the user arbitrarily swings the hologram reader 6, for example, leftwardly and rightwardly, then the locus of the reading out scanning on the hologram memory 3 (locus of a spot of the reproduction reference light L4) may be such as indicated by a broken line in FIG. 2B.

Since it is quite indefinite in what manner the user actually moves the hologram reader 6, the spot of the reproduction reference light L4 is irradiated quite irregularly and unstably on the element holograms on the hologram memory 3. In this state, a reproduction image of element holograms upon which the spot of the reproduction reference light L4 is successively irradiated is read by the hologram reader 6. In other words, reading out of the element holograms h1 to h24 is performed stochastically. The element holograms read by the hologram reader 6 are successively decoded and cumulatively stored by the hologram reader 6. Then at a point of time when a required amount of data is decoded successfully, the hologram reader 6 may re-construct the reproduction data.

On the other hand, in the automatic scanning method, the element holograms on the hologram memory 3 are successively read by the hologram reader 6. To this end, the irradiation position of the reproduction reference light L4 is moved or a unit which holds the collimator lens 4 and the imager 5 is moved by action of an internal scanning mechanism (camera controlling mechanism section 13 of FIG. 13 hereinafter described). For example, automatic scanning may be performed in a state wherein the hologram reader 6 is opposed to the hologram memory 3 adhered to a poster or the like as seen in FIG. 2A. In this instance, it is necessary for the user to merely keep the hologram reader 6 in front of the hologram memory 3. In this state, the irradiation position of the reproduction reference light L4 and the lens system are moved by the scanning mechanism to perform scanning of the hologram memory 3 as indicated by a broken line in FIG. 2A.

Or, for example, a medium wherein a sheet as the hologram memory 3 is adhered to a substrate in the form of a card may be formed and loaded in the hologram reader 6 such that scanning action is performed in the hologram reader 6 to successively read the element holograms.

2. Recording Mode of the Hologram Memory

A recording mode of the hologram memory 3 whose reproduction is performed by the reproduction apparatus (hologram reader 6) of the embodiment is described.

FIG. 3 shows an example of the hologram memory 3 on which element holograms are arranged two-dimensionally. A region indicated by a mark "o" in FIG. 3 indicates an element hologram, and a two-dimensional image can be recorded on such element holograms.

FIG. 3 particularly shows an example of the hologram memory 3 wherein 32 element holograms are arranged in the horizontal direction and 24 element holograms are arranged in the vertical direction on a plane of the hologram memory 3. On each of the element holograms, two-dimensional information of, for example, 512×384 pixels is recorded.

Further, if a multiplexing technique such as angle multiplexing is additionally applied, then a plurality of two-dimensional images can be recorded on one element hologram as described hereinabove.

By converting original recording data into a two-dimensional image as seen in FIG. 1A and by two-dimensionally arraying element holograms on which the data in the form of a two-dimensional image are to be recorded, totaling four-dimensional information can be recorded on the hologram memory 3. Further, if the angle multiplexing is applied to record, for example, two element hologram arrays on a plane of the hologram memory 3, then one more dimension increases, and consequently, five-dimensional information can be recorded.

FIGS. 4A, 4B and 4C show an example of a two-dimensional image recorded on one element hologram. In particular, FIG. 4A shows a two-dimensional array of element holograms, and a two-dimensional image recorded on a certain element hologram from within the two-dimensional array is shown in FIG. 4B or 4C.

Such a two-dimensional image as shown in FIG. 4B or 4C is two-dimensional information of 512×384 pixels described hereinabove. In an encoding process of recording data, such two-dimensional information of 512×384 pixels is generated finally as a physical page. The physical page is displayed on the liquid crystal panel 1 as seen in FIG. 1A to form one element hologram on which the physical page is recorded.

An encoding process until a two-dimensional image as a physical page is generated is described below.

Byte data of a binary code of 8 bits of D0 to D7 is illustrated in FIG. 5A. The byte data is formed from 1 byte in a data stream for recording obtained by performing an encoding process such as an error correction encoding process and an interleaving process for original recording data such as content data.

The byte data of FIG. 5A is converted into a two-dimensional code symbol as a two-dimensional pattern of 4×4 pixels (picture elements) of FIG. 5B. From among the pixels P0, P1, . . . , Pf of the two-dimensional pattern, 13 pixels except the pixels Pf, Pb and Pe are selectively set to a white level or a black level in response to the values of the byte data, that is, 8-bit values of D0 to D7. From among the 13 pixels, three pixels are set to the white level while the remaining ten pixels are set to the black level. Then, one byte value, that is, one of "00000000" to "11111111", is represented by a combination of the three pixels of the white level.

In order to represent byte data of 8 bits, $2^8 = 256$ two-dimensional code symbols are required. Here, "C" represents combination, and if the number of different combinations of three from among 13 pixels is determined, then $13C3 = 286$ Therefore, if the number of pixels of the two-dimensional code symbol is equal to or greater than 13, then the 256 combinations described above can be represented. In short, the one-byte values can be represented by the patterns in which the 13 pixels except the pixels Pf, Pb and Pe are used as described above.

As an example, byte data of a value "01011010", that is, "5Ah" (h represents a hexadecimal notation), is illustrated in FIG. 5C, and the byte data is converted into a two-dimensional code symbol of FIG. 5D. In the example shown, the three pixels P1, P7 and P9 have the white level.

From among the 4×4 pixels, the pixel Pf is determined as a sub sync pixel and allocated to a pixel for an auxiliary synchronization pattern. To the pixel Pf, one of the white level and the black level is allocated upon generation of a group sub sync (Group-SS) hereinafter described.

Meanwhile, the pixels Pb and Pe are determined as sub sync guard pixels for guarding the sub sync pixel. The pixels Pb and Pe normally have the black level.

While data of 1 byte is converted into a two-dimensional code symbol of 4×4 pixels as described above, a group R (Group-R: Group rotated, rotated group) is generated from four bytes, that is, from four two-dimensional code symbols of 4×4 pixels.

Figure 6D:
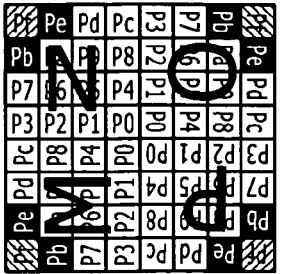
FIGS. 6A, 6B, 6C and 6D are diagrammatic views showing different rotational groups generated by rotation of two-dimensional symbols by individually predetermined angles in generation of a group sub sync.
Figure 6C:
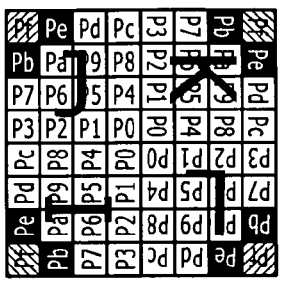
Figure 6B:
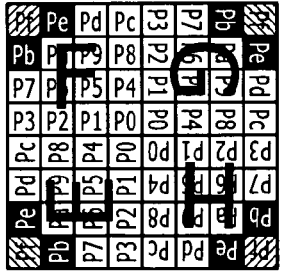
Figure 6A:
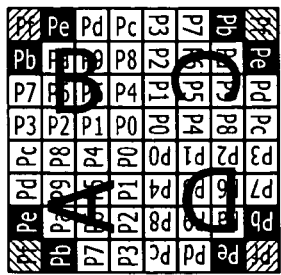

FIGS. 6A, 6B, 6C and 6D illustrate four groups R. In particular, FIG. 6A illustrates a group R generated from byte data A, B, C and D; FIG. 6B illustrates another group R generated from byte data E, F, G and H; FIG. 6C illustrates a further group R generated from byte data I, J, K and L; and FIG. 6D illustrates a still further group R generated from byte data M, N, O and P.

One group R is generated by rotating four two-dimensional code symbols individually by a predetermined amount and then synthesizing the rotated two-dimensional code symbols.

For example, the group R of FIG. 6A is formed by synthesizing the two-dimensional code symbols of the byte data A, byte data B, byte data C and byte data D. In this instance, the four two-dimensional code symbols are synthesized after they are rotated in the following manner:

Two-dimensional code symbol of the byte data A: not rotated.

Two-dimensional code symbol of the byte data B: rotated clockwise by 90°.

Two-dimensional code symbol of the byte data C: rotated by 180°.

Two-dimensional code symbol of the byte data D: rotated counterclockwise by 90°.

Then, the four symbols rotated in this manner are joined together to form the group R of 8×8 pixels shown in FIG. 6A.

Figure 6E:
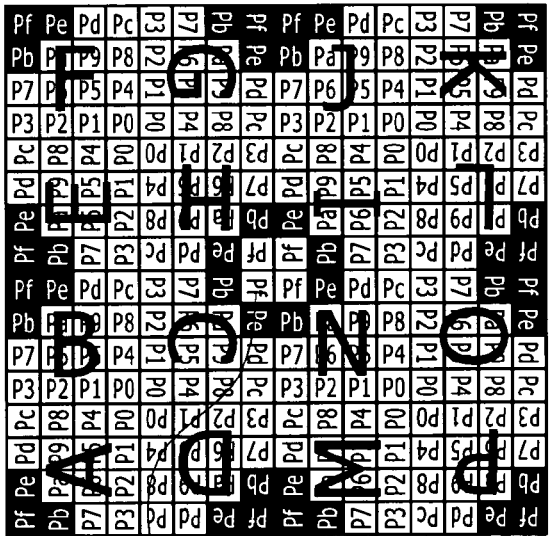
FIG. 6E is a diagrammatic view showing a group sub sync recorded on an element hologram of the hologram memory.

After the four groups R of FIGS. 6A, 6B, 6C and 6D are generated in this manner, they are joined together to generate a group sub sync of 16×16 pixels as seen in FIG. 6E. At this time, since the white level is allocated to the pixel Pf of the two-dimensional pattern of 4×4 pixels regarding the byte data C, H, I and N, the four pixels Pf of 2×2 pixels which gather together at the center of the group sub sync as seen in FIG. 6E form a white region of four pixels. This makes a sub sync pattern.

On the other hand, the black level is allocated to the pixels Pf of the other byte data A, B, D, E, F, G, J, K, L, M, O and P so that the frequency of a white pixel on the group sub sync is suppressed.

Figure 7:
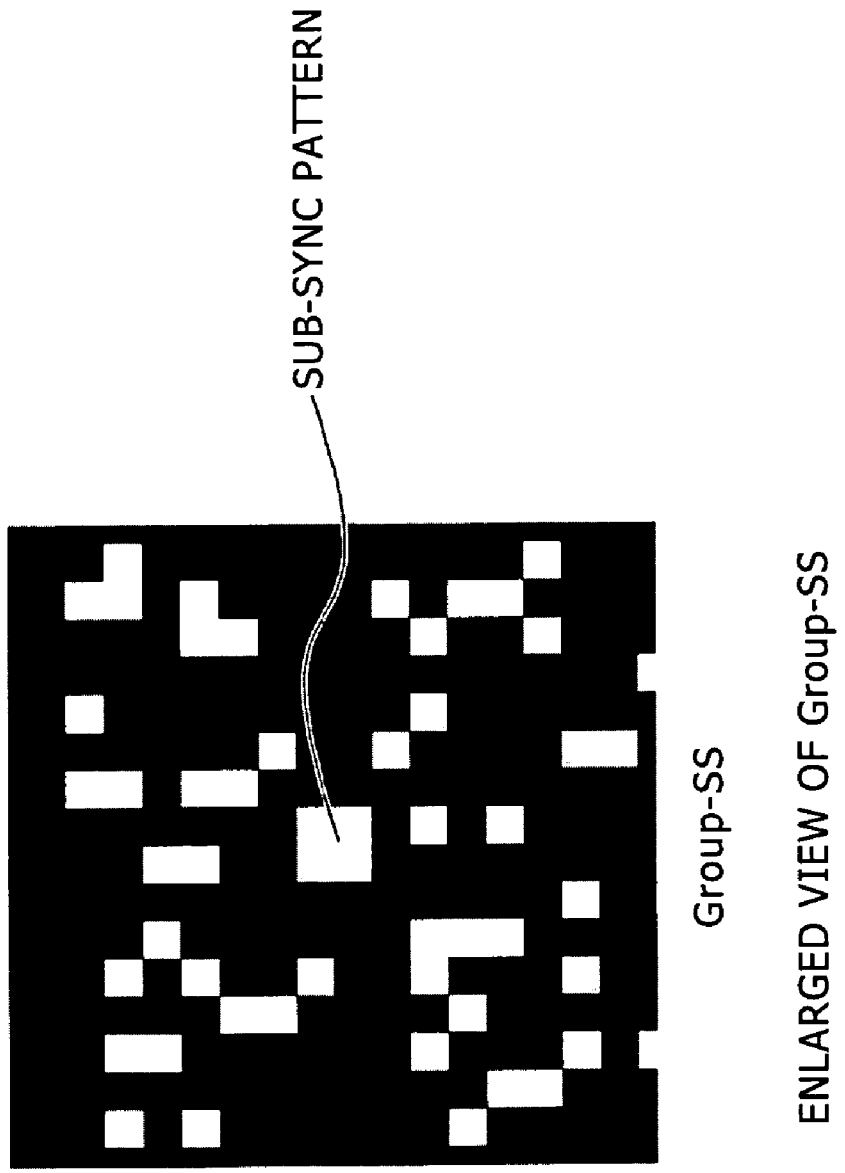
FIG. 7 is a diagrammatic view showing an example of the group sub sync.

FIG. 7 shows an example of the group sub sync of 16×16 pixels generated in this manner. As seen in FIG. 7, a sub sync pattern is formed from four pixels of the white level at the center of the 16×16 pixels while white level pixels and black level pixels are formed in response to a byte data value in a unit of 4×4 pixels.

Figure 8B:
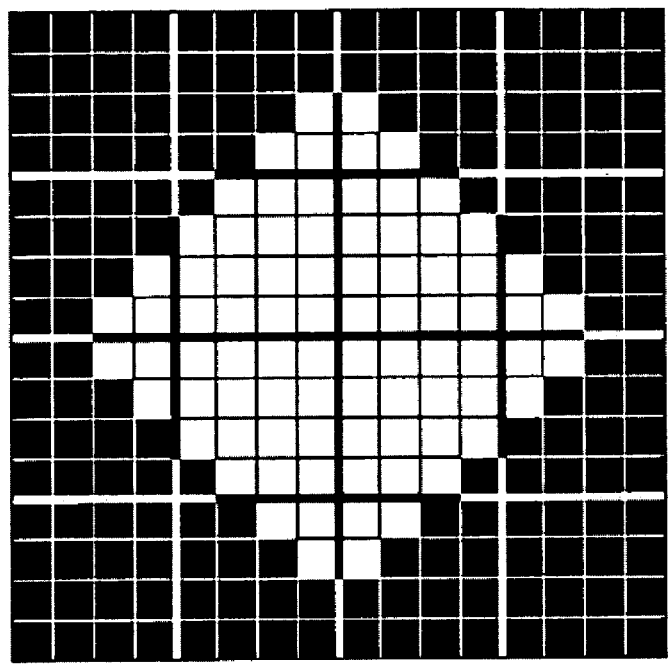
FIG. 8B is a diagrammatic view showing a main synchronization symbol added to an odd-numbered group main sync recorded on an element hologram of the hologram memory.
Figure 8A:
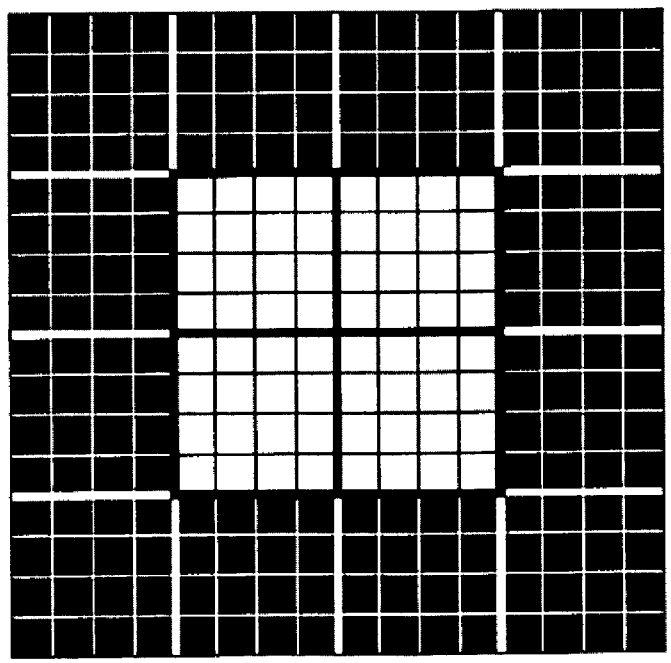
FIG. 8A is a diagrammatic view showing a main synchronization symbol added to an even-numbered group main sync recorded on an element hologram of the hologram memory.

FIGS. 8A and 8B show main synchronization symbols. The main synchronization symbols are formed from 16×16 pixels similarly to the group sub sync described hereinabove.

One of the main synchronization symbols and the group sub sync described above are synthesized to form a group main sync described hereinabove.

The main synchronization symbols are used separately between a group main sync for an odd-numbered two-dimensional pattern and another group main sync for an even-numbered two-dimensional pattern.

FIG. 8A shows a main synchronization symbol for an even-numbered group main sync, and FIG. 8B shows a main synchronization symbol added to an odd-numbered group main sync.

The main synchronization symbol for an even-numbered group main sync of FIG. 8A has a two-dimensional pattern of 16×16 pixels wherein 8×8 pixels at the center have the white level while all of the surrounding pixels have the black level.

The main synchronization symbol for an odd-numbered group main sync of FIG. 8B has a two-dimensional pattern wherein the white level is allocated to those pixels in a two-dimensional pattern of 16×16 pixels which are arranged in a diamond shape at a central portion of the pattern.

Figure 9:
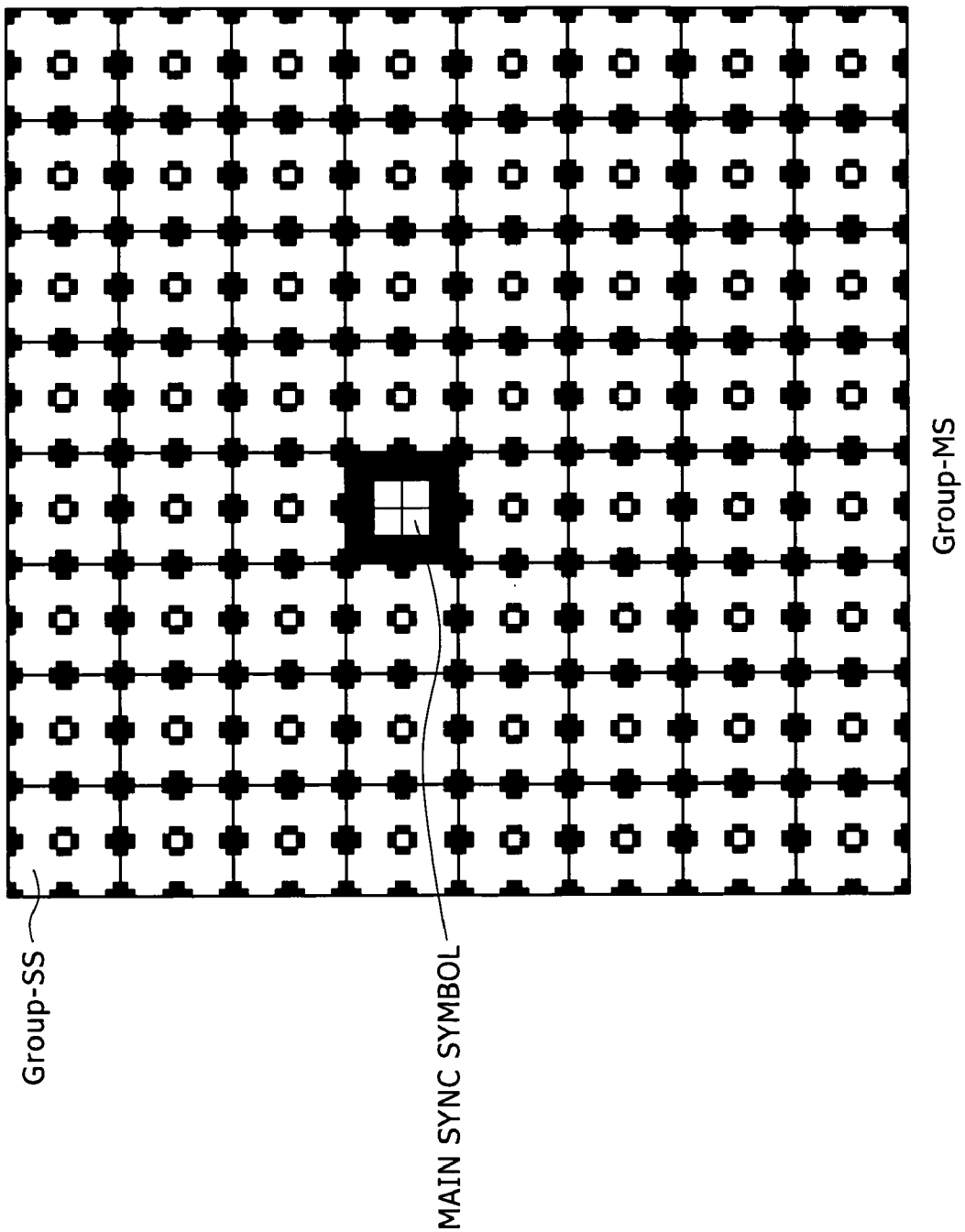
FIG. 9 is a diagrammatic view showing a group main sync recorded on an element hologram of the hologram memory.

A group main sync formed from a group sub sync and a main synchronization symbol is shown in FIG. 9. The group main sync is formed from group sub syncs arrayed such that eight group sub syncs are arrayed in the horizontal direction and eight sub group syncs are arrayed in the vertical direction.

However, a group sub sync at an arbitrary position is made blank and a main synchronization symbol is inserted instead. In FIG. 9, an example is shown wherein a main synchronization symbol is disposed at a substantially central position.

It is to be noted that, since FIG. 9 shows an example of a group main sync for an even-numbered group main sync, the main synchronization symbol of FIG. 8A is inserted. For an odd-numbered group main sync, the main synchronization symbol of FIG. 8B is disposed.

Such group main syncs are arrayed on a two-dimensional plane to form a physical image. An example of a configuration of a physical page is shown in FIG. 10.

Figure 10:
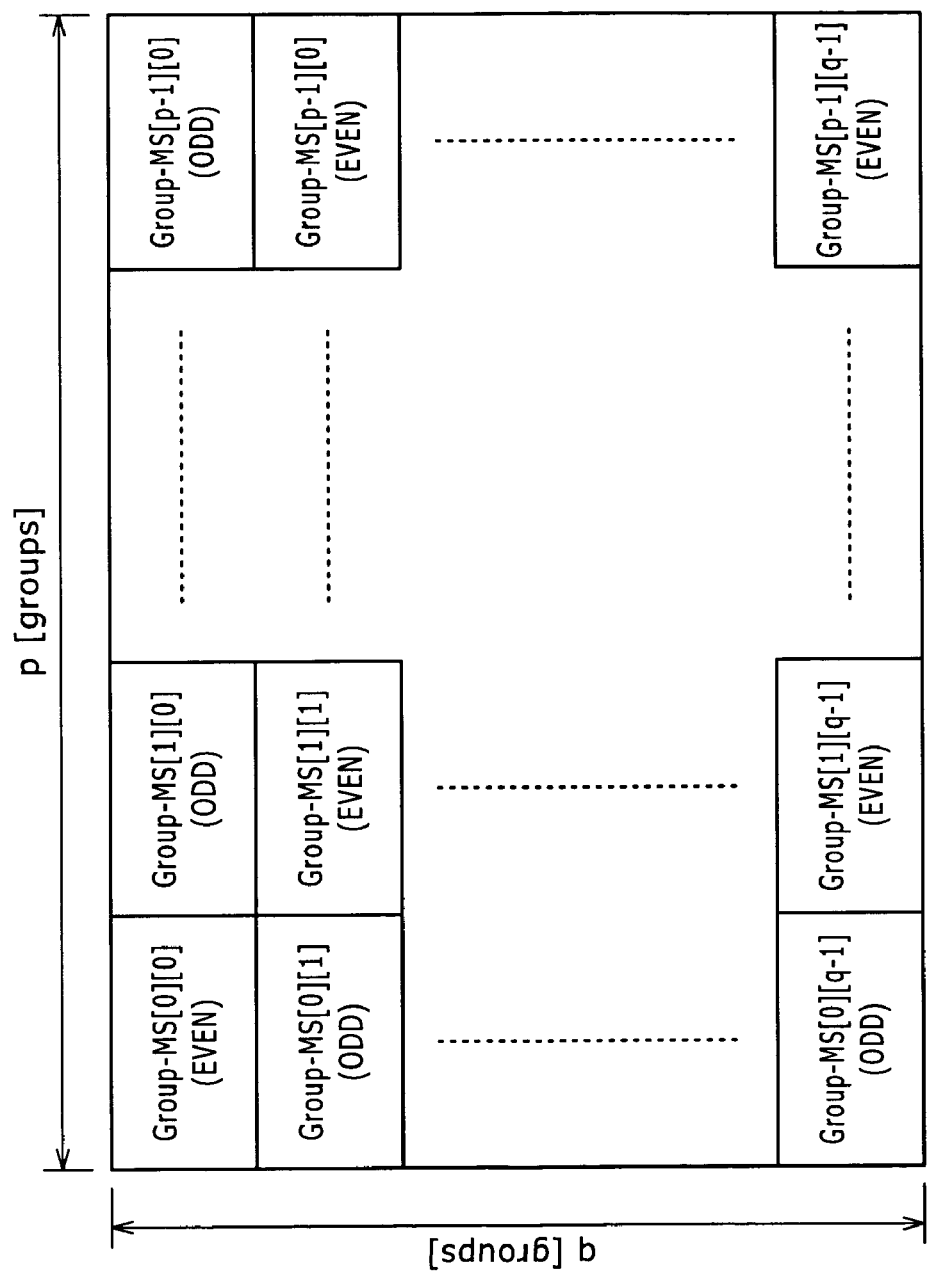
FIG. 10 is a diagrammatic view showing a physical page which forms an element hologram of the hologram memory.

FIG. 10 illustrates an example wherein group main synchs Group-MS[0] [0], . . . , Group-MS[p−1] [q−1] are arrayed such that p groups are arrayed horizontally and q groups are arrayed vertically to form a physical page (Physical Page).

An image of such physical pages (Physical Pages) is displayed as the two-dimensional page data of FIG. 1A on the liquid crystal panel 1.

It is to be noted that, in the physical page of FIG. 10, "EVEN" or "ODD" is applied to each of the group main syncs such that the group main sync is an even-numbered group main sync or an odd-numbered group main sync. Further, odd-numbered group main syncs and even-numbered group main syncs are arranged alternately in both of the vertical direction and the horizontal direction.

As described above, the main synchronization symbol of FIG. 8A is added to an even-numbered group main sync while the main synchronization symbol of FIG. 8B is added to an odd-numbered group main sync as described above.

Figure 11:
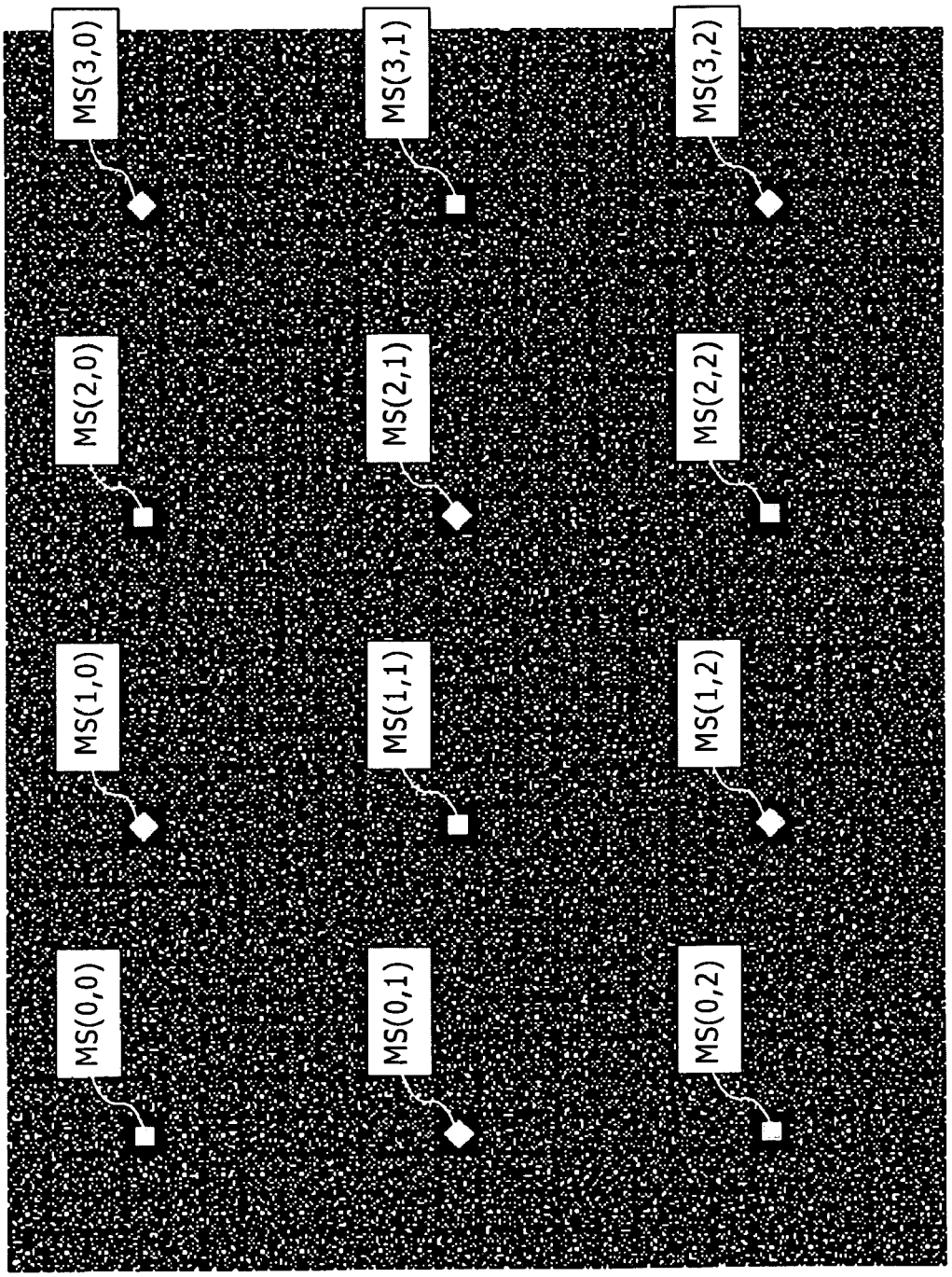
FIG. 11 is a schematic view showing an example of an array of main synchronization symbols recorded on an element hologram of the hologram memory.

Actual examples of the physical page are shown in FIGS. 11 and 12. In particular, FIGS. 11 and 12 show physical pages wherein the horizontal and vertical group numbers p and q are set to p=4 and q=3 such that group main syncs of four groups are arrayed in the horizontal direction and group main syncs of three groups are arranged in the vertical direction. Since one group main sync includes 128×128 pixels, the physical pages are formed from 512×384 pixels.

If this is represented using a unit of a group sub sync, then a physical page is formed from group sub syncs arranged such that 32 group sub syncs are arranged in the horizontal direction and 24 group sub syncs are arranged in the vertical direction.

Figure 12A:
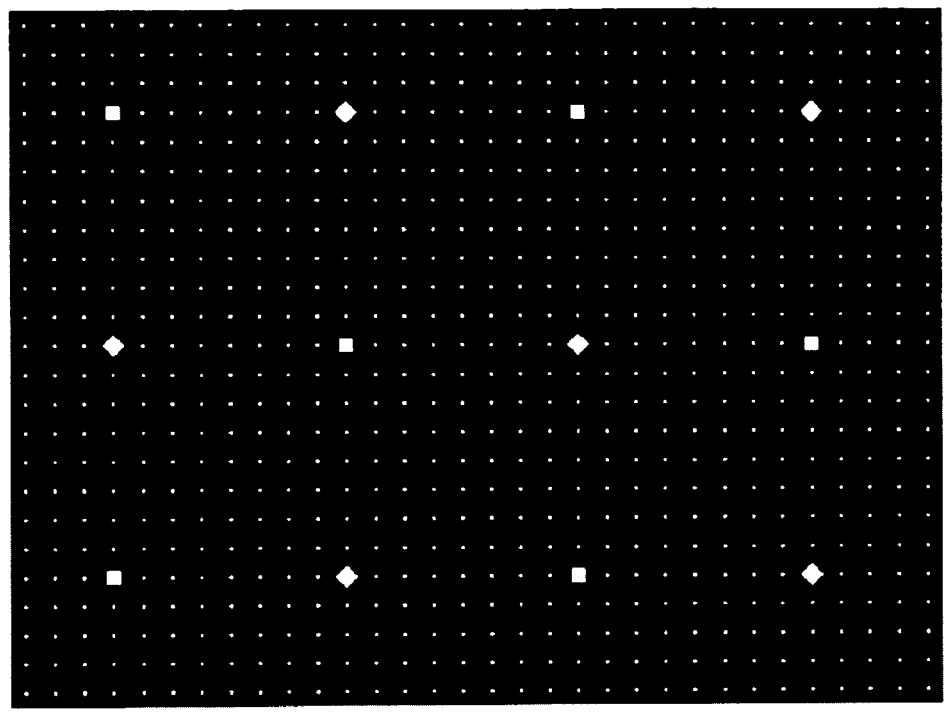
FIG. 12A is a schematic view illustrating an example of a two-dimensional synchronization signal and showing a two-dimensional image recorded on an element hologram of the hologram memory.
Figure 12B:
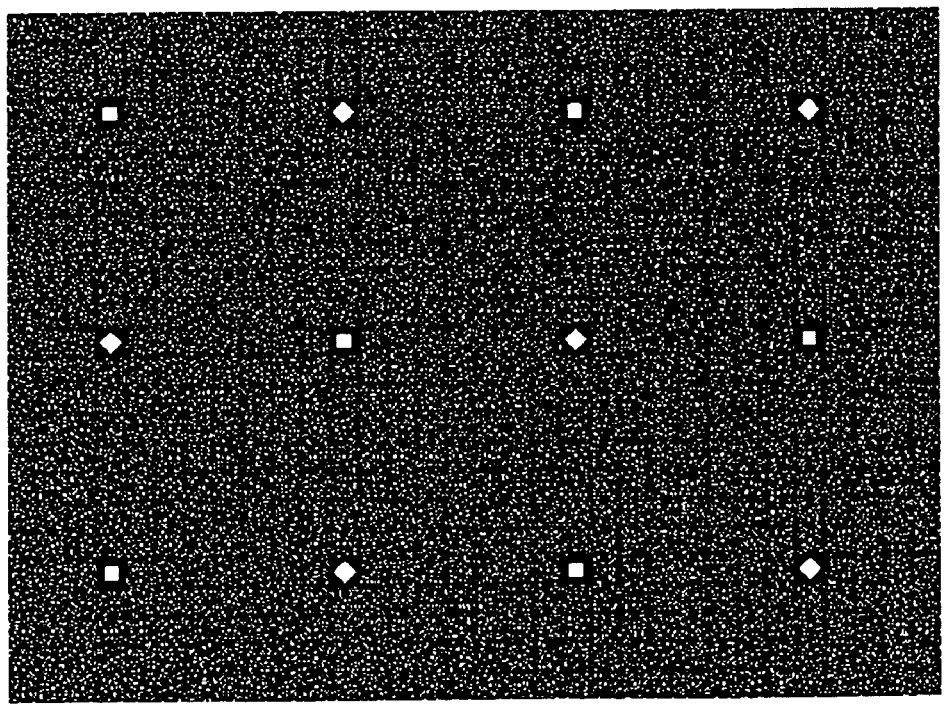
FIG. 12B is a similar view but illustrating an example of random pattern modulation and showing the two-dimensional image of the element hologram.

FIG. 12B illustrates an example of a two-dimensional image (physical page) where data of a random pattern are two-dimensionally modulated.

FIG. 12A shows only main synchronization symbols and sub synchronization patterns in a two-dimensional image.

As seen in FIG. 11, synchronization symbols MS(0, 0) to MS(3, 2) are disposed in a unit of a group main sync on a two-dimensional image as a physical page.

The main synchronization symbols are special patterns for establishing relative positions of and positional synchronism between two-dimensional images and are suitably arranged two-dimensionally in response to a medium characteristic and a performance of the optical system.

Further, while a sub synchronization pattern in a group sub sync is provided for detection of microscopic geometrical distortion in the group sub sync, a main synchronization symbol is provided for detection of macroscopic geometrical distortion.

It is to be noted that signal processing relating to correction and binarization by the hologram reader 6 hereinafter described is executed in a basic unit of a group sub sync (Group-SS).

3. Configuration of the Hologram Reader

A configuration of the hologram reader 6 as a hologram reproduction apparatus of the present embodiment is described with reference to FIG. 13.

The hologram reader 6 includes four blocks of an image pickup section 10, a signal processing section 20, a memory section 30 and an external apparatus IF section 40. The blocks mentioned individually perform required action under the control of a system controller 51.

The system controller 51 is formed typically from a microcomputer and controls the components of the hologram reader 6 in order to execute action to read data from the hologram memory 3.

Further, the system controller 51 supervises operation information of an operation section 53 and performs necessary control in response to an operation of the operation section 53 by the user. Furthermore, the system controller 51 controls a display section 52 to display various kinds of information to be presented to the user.

The image pickup section 10 is a block for picking up a two-dimensional image reproduced from an element hologram of the hologram memory 3. The image pickup section 10 includes a collimator lens 11, an image pickup device section (imager) 12, a camera controlling mechanism section 13, a light emission drive section 14, a hologram scan control section 15, and a reference light source 16.

The collimator lens 11 and the image pickup device section 12 correspond to the collimator lens 4 and the imager 5 described hereinabove with reference to FIG. 1B, respectively. The image pickup device section 12 detects a two-dimensional image and may be formed from a CMOS image sensor, a CCD image sensor or the like.

The camera controlling mechanism section 13 controls the positional relationship between the image pickup device section 12 (or reference light source 16) and the hologram memory 3 and has a function of controlling a movable section manually or automatically. It is to be noted that, where such a manual scanning system as described hereinabove with reference to FIGS. 2A and 2B is adopted, the camera controlling mechanism section 13 is not required.

The reference light source 16 is disposed on the housing of the hologram reader 6 such that it irradiates reproduction reference light L4 upon the hologram memory 3 at an angle equal to that of the recording reference light L3 upon recording illustrated in FIG. 1A. Where the reference light source 16 is formed from, for example, a light emitting diode (LED) or a semiconductor laser, it is driven by the light emission drive section 14 to emit light. When reproduction of the hologram memory 3 is performed by the hologram reader 6, the light emission drive section 14 drives the reference light source 16 to emit light in accordance with an instruction of the system controller 51.

The hologram scan control section 15 determines an image pickup timing and a readout pixel in hologram scanning based on a state of a two-dimensional image read from the image pickup device section 12 and a scanning situation till then stored in a variable memory 26 hereinafter described. Then, the hologram scan control section 15 provides a scanning timing signal and a scanning address signal to the image pickup device section 12 to control image pickup action of the image pickup device section 12. Further, the hologram scan control section 15 processes a two-dimensional image signal obtained by the image pickup device section 12.

The signal processing section 20 performs signal processing for a series of two-dimensional images picked up by the image pickup section 10. The signal processing section 20 includes a memory controller 21, an optical correction variable calculation section 22, a geometrical distortion correction variable calculation section 23, a binarization section 24, a decoding section 25, and a variable memory 26.

The memory controller 21 performs arbitration in writing/reading out of data into/from the memory section 30 among the hologram scan control section 15, optical correction variable calculation section 22, geometrical distortion correction variable calculation section 23, binarization section 24 and decoding section 25.

The optical correction variable calculation section 22 detects a luminance dispersion state within a two-dimensional image and determines an optical correction variable.

The geometrical distortion correction variable calculation section 23 detects geometrical distortion within a two-dimensional image and determines a geometrical correction variable.

The binarization section 24 binarizes a two-dimensional image based on such an optical correction variable and a geometrical correction variable as mentioned above.

The decoding section 25 decodes data binarized by the binarization section 24 to reproduce information read out from the hologram memory 3.

The variable memory 26 stores an optical correction variable calculated by the optical correction variable calculation section 22 and a geometrical correction variable calculated by the geometrical distortion correction variable calculation section 23.

The memory section 30 has a function of storing a two-dimensional image transferred thereto from the hologram scan control section 15, another function of storing an intermediate result of signal processing executed by the signal processing section 20 and a further function of storing information decoded by the decoding section 25. The memory section 30 includes an information memory 31 serving as a first storage region and a nonvolatile memory 32 serving as a second storage region.

The information memory 31 is formed typically from a dynamic random access memory (DRAM) and serves as a storage region for storing a two-dimensional image transferred from the hologram scan control section 15. The stored two-dimensional image is read out for processing by the optical correction variable calculation section 22, geometrical distortion correction variable calculation section 23 and binarization section 24.

The nonvolatile memory 32 serves as a storage region for information decoded by the decoding section 25 such as, for example, audio/video information.

The external apparatus IF section 40 transmits audio/video information or some other information read out by the hologram reader 6 to an external apparatus 100 and includes an external apparatus interface 41.

Action of the components of the hologram reader 6 when data are read out from the hologram memory 3 is described.

In order to scan the hologram memory 3, the light emission drive section 14 drives the reference light source 16 to emit light. Reproduction image light of an element hologram is obtained from the hologram memory 3 upon which the reproduction reference light L4 is irradiated. The reproduction image light forms an image on the image pickup device section 12 through the collimator lens 4. The two-dimensional image formed on the image pickup device section 12 is converted into an electric signal and transferred to the hologram scan control section 15.

The hologram scan control section 15 controls action of the image pickup device section 12 and processes the two-dimensional image signal obtained by the image pickup device section 12.

In particular, the hologram scan control section 15 supplies a scanning timing signal, a scanning address signal and other necessary signals to the image pickup device section 12. Consequently, two-dimensional image signals successively obtained from the solid-state image pickup device array by image pickup action are successively outputted and transferred from the image pickup device section 12. Then, the hologram scan control section 15 performs a sampling process, an AGC process, an A/D conversion process and other necessary processes for each of the two-dimensional signals successively transferred thereto, and outputs a resulting signal.

The two-dimensional image signal in the form of digital data outputted from the hologram scan control section 15 is stored into the information memory 31 under the control of the memory controller 21.

From the two-dimensional image signals stored in the information memory 31, an optical correction variable is calculated by the optical correction variable calculation section 22. In particular, each two-dimensional image signal is transferred from the information memory 31 to the optical correction variable calculation section 22. Thus, the optical correction variable calculation section 22 calculates a correction variable for correction of optical distortion and adjustment of the brightness which are variations of data values provided by optical causes. The optical correction variable calculation section 22 stores the calculated optical correction variable into the variable memory 26.

It is to be noted that the optical correction variable calculation section 22 does not actually perform an optical correction process for a two-dimensional image signal but merely performs a process of calculating and storing an optical correction variable into the variable memory 26. In other words, action of correcting a two-dimensional image and transferring the corrected two-dimensional image signal to the information memory 31 so as to update the information memory 31 into a state wherein the two-dimensional image is corrected is not performed.

Further, from the two-dimensional image signals stored in the information memory 31, a geometrical correction variable is calculated by the geometrical distortion correction variable calculation section 23. In particular, each two-dimensional image signal is transferred from the information memory 31 to the geometrical distortion correction variable calculation section 23. Thus, the geometrical distortion correction variable calculation section 23 calculates a correction variable for geometrical correction such as image position displacement correction and image rotation displacement correction. The geometrical distortion correction variable calculation section 23 stores the calculated geometrical correction variable into the variable memory 26.

It is to be noted that also the geometrical distortion correction variable calculation section 23 does not actually perform a geometrical correction process for a two-dimensional image signal but merely performs a process of calculating and storing a geometrical correction variable into the variable memory 26. In other words, action of correcting a two-dimensional image and transferring the corrected two-dimensional image signal to the information memory 31 so as to update the information memory 31 into a state wherein the two-dimensional image is corrected is not performed.

The two-dimensional image signal with regard to which the optical correction variable and the geometrical correction variable are stored into the variable memory 26 by the processes of the optical correction variable calculation section 22 and the geometrical distortion correction variable calculation section 23 is transferred from the information memory 31 to and binarized by the binarization section 24. The two-dimensional image signal has been obtained as picked up image data having gradations by the image pickup device section 12, and the binarization section 24 performs a binarization process for converting the two-dimensional image signal into two values of white and black (bright and dark). This is because data to be read from the hologram memory 3 are two-dimensional page data obtained by converting original recording data into binary data of white and black.

The binarization section 24 performs the binarization process using the optical correction variable and the geometrical correction variable stored in the variable memory 26 with regard to the two-dimensional image signal. While particular processing is hereinafter described, the binarization section 24 adjusts coordinates upon reading in of the two-dimensional image from the information memory 31 based on the geometrical correction variable and sets a threshold value for binarization based on the optical correction variable.

Since the binarization process is performed by the binarization section 24 using the optical correction variable and the geometrical correction variable, the binarized two-dimensional image signal is placed in a state wherein optical correction and geometrical distortion correction are executed already.

The two-dimensional image signal binarized by the binarization section 24 is transferred to the decoding section 25 directly or through the information memory 31.

The decoding section 25 performs a decoding process and an error correction process for the binarized two-dimensional image signal, that is, data obtained from one element hologram, to decode the original data.

The decoding section 25 passes the decoded data to the memory controller 21. The memory controller 21 stores the decoded data into the nonvolatile memory 32.

The two-dimensional image signals obtained from individual element holograms of the hologram memory 3 are successively decoded by the decoding section 25 and accumulated into the nonvolatile memory 32. Consequently, the original data recorded on the hologram memory 3 such as, for example, AV contents data or computer data are constructed in the nonvolatile memory 32.

The data re-constructed in the nonvolatile memory 32 are transferred as reproduction data from the hologram memory 3, for example, to a personal computer, an AV apparatus such as an audio player or a video player, or an external apparatus such as a portable telephone set through the external apparatus interface 41. The external apparatus interface 41 may be, for example, a USB interface. Naturally, the external apparatus interface 41 may be an interface of any other standards than the USB standards. The user can utilize the reproduction data from the hologram memory 3 on the external apparatus 100 side. For example, the user can utilize computer data on a personal computer or reproduce AV content data on an AV apparatus or a portable telephone set.

Figure 13:
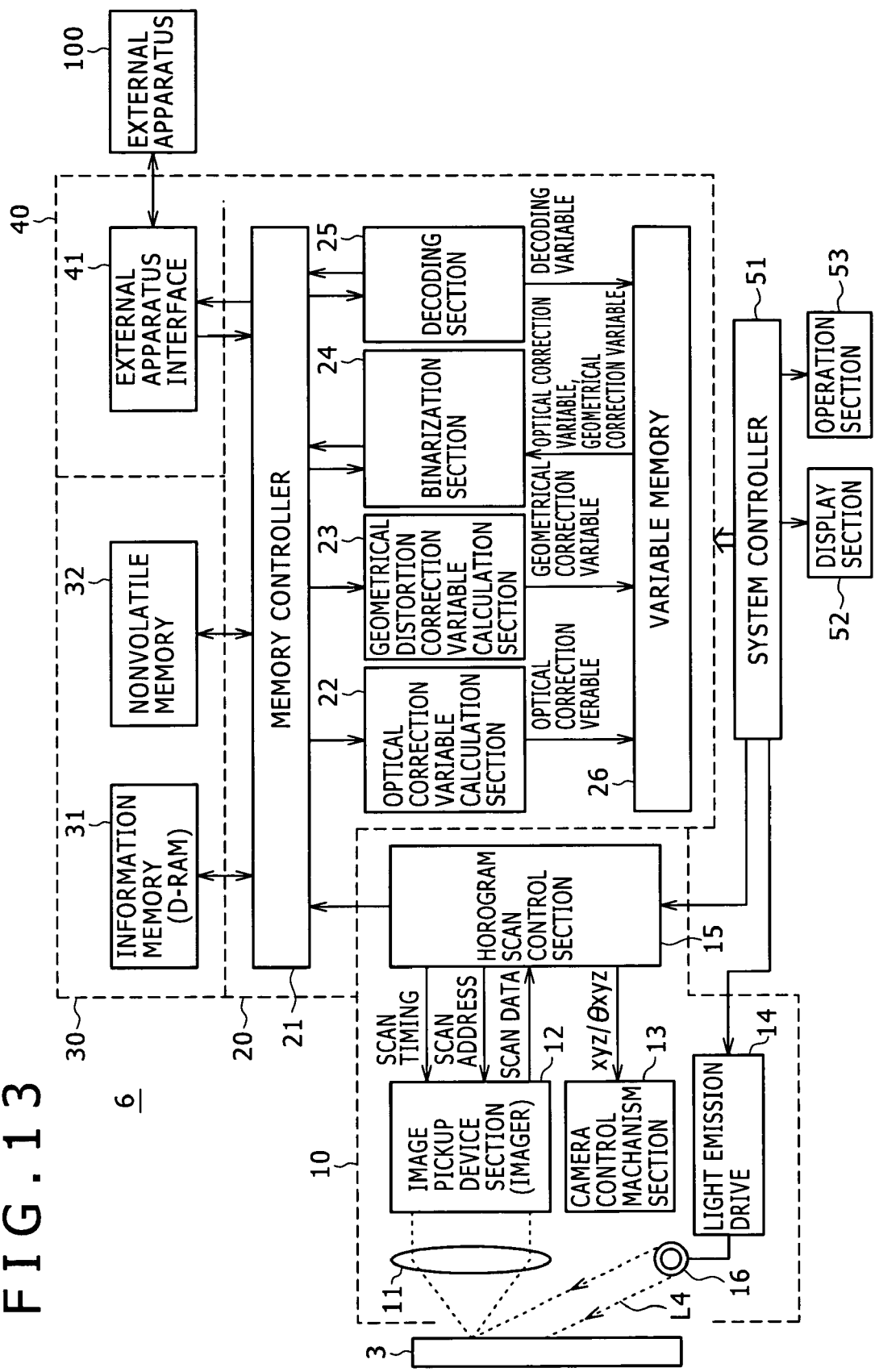
FIG. 13 is a block diagram of the hologram reader.

Though not shown in FIG. 13, a medium drive for recording data on a predetermined recording medium may be used to record reproduction data on the recording medium.

The recording medium may typically be an optical disk or a magneto-optical disk. In particular, variable disks which can be recorded by various systems such as, for example, a CD (Compact Disc) system, a DVD (Digital Versatile Disc) system, a blue ray disk (Blu-Ray Disc) system and a mini disk (Mini Disc) system can be used as the recording medium. Where any of such disks is used as the recording medium, the medium drive performs an encoding process, an error correction code process, a compression process and so forth suitable for the type of the disk to record the reproduced data on the disk.

Also a hard disk may possibly be used as the recording medium. In this instance, the medium drive is formed as a hard disk drive (HDD).

Further, the recording medium may be implemented also as a portable memory card in which a solid-state memory is built or as a built-in type solid-state memory. In this instance, the medium drive is constructed as a recording apparatus section for the memory card or the built-in type solid-state memory and performs necessary signal processing to record reproduced data.

Furthermore, also it is a possible idea, for example, to provide a sound reproduction outputting system and an image reproduction outputting system which reproduce AV content data recorded on the recording medium using the medium drive and decode and output the reproduced AV content data.

Also it is possible to transfer data reproduced by the medium drive to an external apparatus through the external apparatus interface 41.

Furthermore, where data are recorded on a portable recording medium such as a CD, a DVD, a Blu-ray disk, a mini disk or a memory card mentioned hereinabove, the user can utilize reproduction data read out from the hologram memory 3 by causing the external apparatus to reproduce the recording medium.

It is to be noted that basically the reproduction action (data downloading action) of performing scanning of the hologram memory 3 to read out data and the action of transferring the resulting data such as audio/video data to the external apparatus 100 or reproducing and outputting the data by means of a reproduction system as described hereinabove are not performed simultaneously. Therefore, the memory configuration can be simplified by replacing either one or both of the information memory 31 and the nonvolatile memory 32 of the memory section 30 with some other storage section provided in the reproduction apparatus.

For example, if decoded data are recorded on a recording medium such as an optical disk or a HDD as described above, then the nonvolatile memory 32 can be eliminated by storing the data in the information memory 31 before reproduction data re-construction.

4. Reproduction Process

Figure 14:
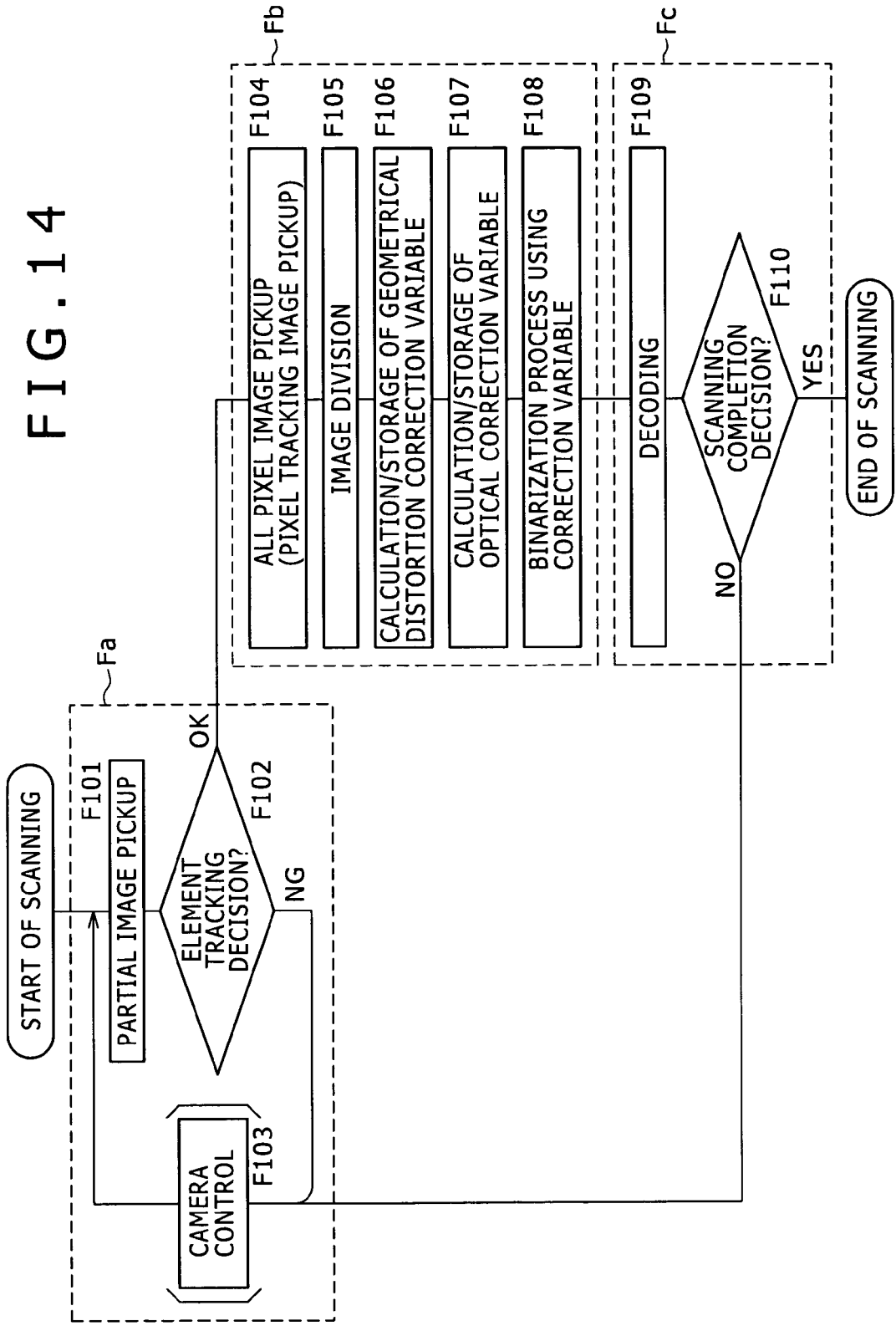
FIG. 14 is a flow chart illustrating a reproduction process of the hologram reader.

A process of the hologram reader 6 upon reproduction is illustrated in FIG. 14. In particular, FIG. 14 illustrates processes executed by the components of the hologram reader 6 shown in FIG. 13 under the control of the system controller 51.

Referring to FIG. 14, the process upon reproduction illustrated is roughly divided into three processes of an element tracking process Fa, an image processing process Fb and a decoding step Fc.

The element tracking process Fa involves pickup of a partial two-dimensional image in a region of part of a two-dimensional image on the element holograms of the hologram memory 3. The element tracking process Fa further involves decision of a tracking state with regard to the element holograms from the picked up partial two-dimensional image.

Meanwhile, the image processing process Fb involves pickup of an entire two-dimensional image of the element holograms at a timing at which it is decided that the tracking is in a favorable state.

Further, the image processing process Fb involves correction variable calculation and binarization regarding a two-dimensional image of the element holograms.

The decoding step Fc involves decoding of a binarized two-dimensional image signal to obtain reproduction data.

In the beginning, the element tracking process Fa is described.

In order to start reproduction scanning, the system controller 51 controls the light emission drive section 14 to start emission of the reproduction reference light L4 by the reference light source 16. Where the hologram reader 6 is configured for such manual scanning by the user as described hereinabove with reference to FIGS. 2A and 2B, the element tracking process Fa is executed while the reproduction reference light L4 is irradiated.

On the other hand, where the hologram reader 6 is configured otherwise such that it includes the camera control mechanism section 13 by which the scanning position is controlled, the system controller 51 issues an instruction to the hologram scan control section 15 to start action of the camera control mechanism section 13.

The element tracking process Fa is executed by repetitions of partial image pickup at step F101, element tracking decision at step F102 and camera control at step F103. It is to be noted that, where the hologram reader 6 is configured for manual scanning, the camera control at step F103 is not executed, and the element tracking process Fa is executed by repetitions of the processes at steps F101 and F102.

After irradiation of the reproduction reference light L4 is started to start scanning, the hologram scan control section 15 executes the element tracking process Fa. In particular, the hologram scan control section 15 issues a scanning timing signal and a scanning address signal to control the image pickup device section 12 to execute the partial image pickup at step F101 after every predetermined interval of time to fetch a partial two-dimensional image signal. Then at step F102, the hologram scan control section 15 performs the process of deciding tracking from the partially picked up partial two-dimensional image signal.

If it is decided at step F102 that the tracking state is favorable, then the processing advances to the image processing process Fb. However, if it is decided that the tracking state is not favorable, then the hologram scan control section 15 modifies the tracking position at the camera control at step F103, whereafter it returns the processing to step F101. On the other hand, where the hologram reader 6 is configured for manual scanning, the processing returns directly to step F101 because the process at step F103 is not involved.

Such action of the element tracking process Fa is described with reference to FIGS. 15, 16A, 16B and 17.

FIG. 15 shows an example of a full image (512×384 pixels) of a certain element hologram formed on the image pickup device section 12 and a region AR1 whose partial image is to be picked up.

In the partial image pickup at step F101, the hologram scan control section 15 performs a process of fetching an image only of the region AR1 from within the formed image of FIG. 15. Then, the hologram scan control section 15 decides a tracking state at step F102 from the image signal of the region AR1, that is, from the partial two-dimensional image signal.

Figure 16A:
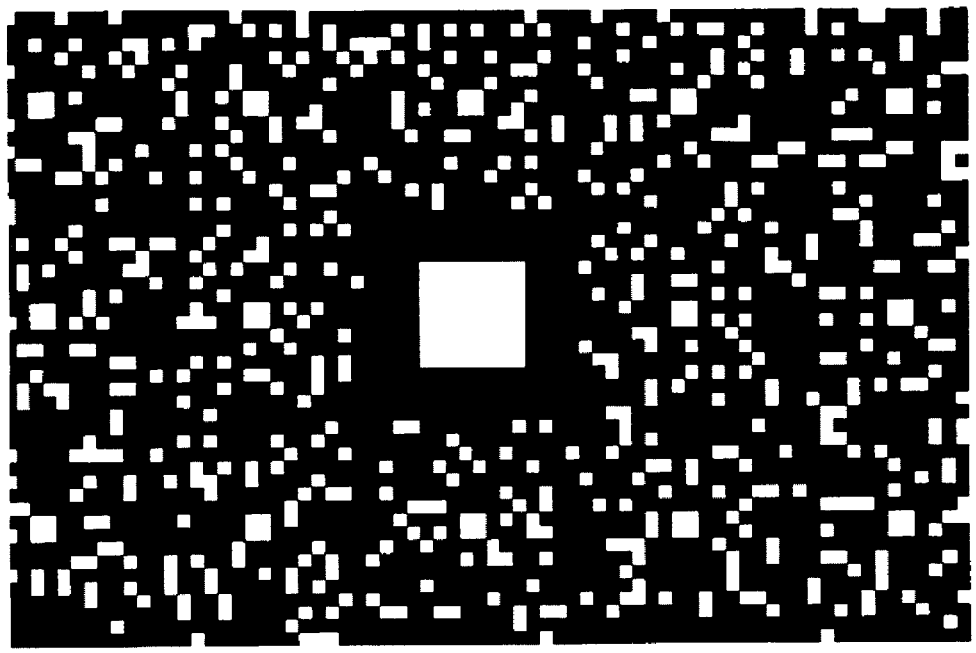
FIG. 16A is a diagrammatic view showing an image picked up in response to a tracking state by the hologram reader particularly when the tracking state is favorable.
Figure 16B:
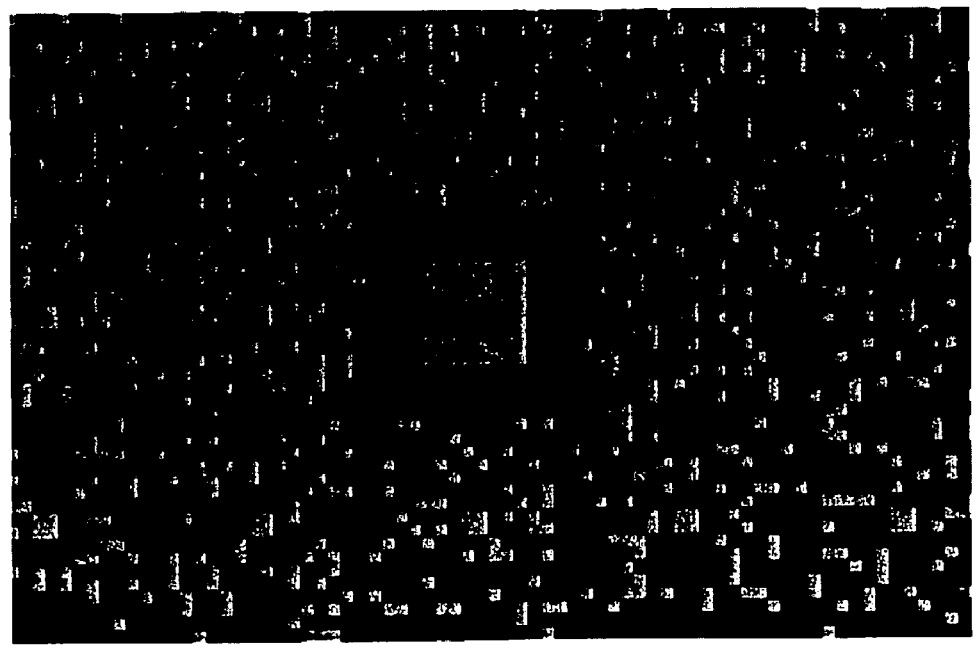
FIG. 16B is a diagrammatic view showing an image picked up in response to a tracking state by the hologram reader particularly when the tracking state is not favorable.

FIGS. 16A and 16B show examples of the partially picked up image of the region AR1. In particular, FIG. 16A shows a partially picked up image when the tracking is favorable while FIG. 16B shows another partially picked up image when the tracking is not favorable.

It is known that the reproduction tracking state of an element hologram appears as a difference in luminance. Naturally, upon reproduction, it is necessary to pick up such an image which is as clear in difference in luminance as possible as seen in FIG. 16A.

The decision of the tracking state thus decides whether or not the hologram reader 6 is conditioned such that such an image as shown in FIG. 16A can be picked up. If the tracking state is not appropriate, then the luminance of white level pixels drops as seen in FIG. 16B. Accordingly, the tracking state can be decided, for example, depending upon the magnitude of a luminance level sum value obtained by adding the luminance level of the pixels in the fetched image.

However, if the addition of the luminance level to make the decision is performed with regard to the entire image of, for example, 512×384 pixels, then this imposes a heavy processing burden and requires a long processing period of time.

Here, the dispersion in magnitude of the luminance arising from the tracking state has a characteristic that it appears uniformly over the entire image.

Therefore, in the present example, in place of the decision of the luminance state with regard to the entire fetched image for the tracking decision, the luminance state is decided from the partial two-dimensional image signal of the region AR1 whose partial image is picked up.

Specifically, the tracking state can be decided depending upon a luminance level sum value obtained by adding the luminance level of the pixels in the region AR1 as shown in FIG. 16. This can remarkably decrease the number of pixels to be added and decrease the processing burden and allows the decision process of the tracking state to be performed at a very high speed.

It is to be noted that, at step F101, an image of any portion in one two-dimensional image read from an element hologram can be picked up arbitrarily. While the region AR1 shown in FIG. 15 is a region centered at one main synchronization symbol, it may otherwise be a region which includes some other main synchronization symbol or which does not include any main synchronization symbol.

FIGS. 17 and 18 illustrate different relationships between the tracking state and the luminance level.

FIG. 17 illustrates a relationship where the scanning locus passes the centers of different element holograms, for example, like a scanning locus SK1 shown in FIG. 4. Meanwhile, FIG. 18 illustrates a relationship where the scanning locus passes a gap between different element holograms like another scanning locus SK2 shown in FIG. 4.

When scanning is performed such that it forms a scanning locus SK1 which passes the centers of element holograms ha, hb, hc and hd as seen in FIG. 17, the luminance level sum value of the pixels on the partial two-dimensional image becomes such as illustrated in FIG. 17.

In particular, the luminance level sum value exhibits its maximum at a timing tJT at which each of the element holograms ha, hb, hc and hd is just on the track, but exhibits its minimum at a timing tOT at which each of the element holograms ha, hb, hc and hd is off the track.

Here, a luminance level threshold value THR is set as a criterion for the image pickup state of an element hologram, that is, for the tracking state. Then, whether the tracking state is favorable or not is decided depending upon whether or not the luminance level sum value reaches the luminance level threshold value THR.

The partial image pickup at step F101 is carried out repetitively, for example, after every timing interval tsp along the time axis of FIG. 17. However, since, for example, within a period t1, since the luminance level sum value does not reach the luminance level threshold value THR, a decision of tracking NG is made at step F102 within the period t1. On the other hand, if the partial image pickup at step F101 is performed at a certain point of time within another period t2, then the luminance level sum value exceeds the luminance level threshold value THR. Therefore, another decision of tracking OK is made at step F102.

Thus, in FIG. 17, within the periods t1, t3, t5, t7 and t9, the tracking state decision is NG, but within the periods t2, t4, t6 and t8, the tracking state decision with regard to the element holograms ha, hb, hc and hd is OK.

For example, as regards the element hologram ha, while the processes at steps F101 and F102 are repeated, the tracking NG decision is made within the period t1, but when the period t2 is entered, the tracking OK decision is made at step F102. In this instance, the processing advances from step F102 to step F104. Consequently, data reading out of the element hologram ha is thereafter performed by processes at steps beginning with step F104 as hereinafter described. This similarly applies also to the other element holograms.

FIG. 18 illustrates the relationship between the tracking state and the luminance level where the scanning locus SK2 does not exhibit a just tracking state on the element holograms. In this instance, a state wherein the luminance level sum value does not reach the luminance level threshold value THR continues as seen in FIG. 18. Accordingly, the element tracking process Fa is repeated, and it is waited that such a just tracking state as described hereinabove with reference to FIG. 17 is obtained. For example, it is waited that the locus of manual scanning exhibits a just tracking state with regard to a certain element hologram. Alternatively, it is waited that a just tracking state with regard to a certain element hologram is obtained while the scanning position is successively changed by the camera control mechanism section 13.

In the process of FIG. 14, the processing advances to the image processing process Fb at a point of time when the tracking decision OK is obtained with regard to a certain element hologram by such an element tracking process Fa as described above. In the image processing process Fb, all pixel image pickup at step F104, image division at step F105, calculation/storage of a geometrical correction variable at step F106, calculation/storage of an optical correction variable at step F107 and binarization at step F108 are performed.

First at step F104, the hologram scan control section 15 controls the image pickup device section 12 to execute all pixel image pickup of an element hologram. In particular, the hologram scan control section 15 fetches a two-dimensional image signal of all pixels of a certain element hologram with regard to which the tracking OK decision is made at the point of time. Since the two-dimensional image signal is fetched in the tracking OK state, the two-dimensional image signal obtained has a luminance level which is assured to be higher than a prescribed level. The hologram scan control section 15 performs a predetermined process for the two-dimensional image signal fetched by the all pixel image pickup to convert the two-dimensional image signal into digital values and outputs the digital values. The data of the two-dimensional image signal are stored into the information memory 31 under the control of the memory controller 21.

Figure 19A:
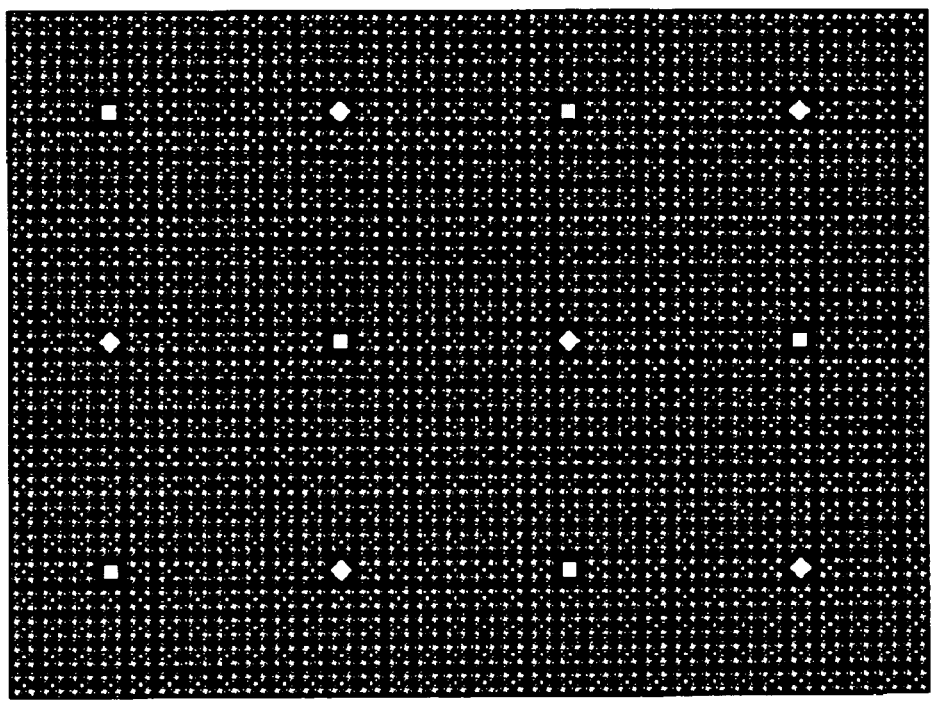
FIG. 19A is a schematic view showing an example of a recording image recorded on an element hologram of the hologram memory.
Figure 19B:
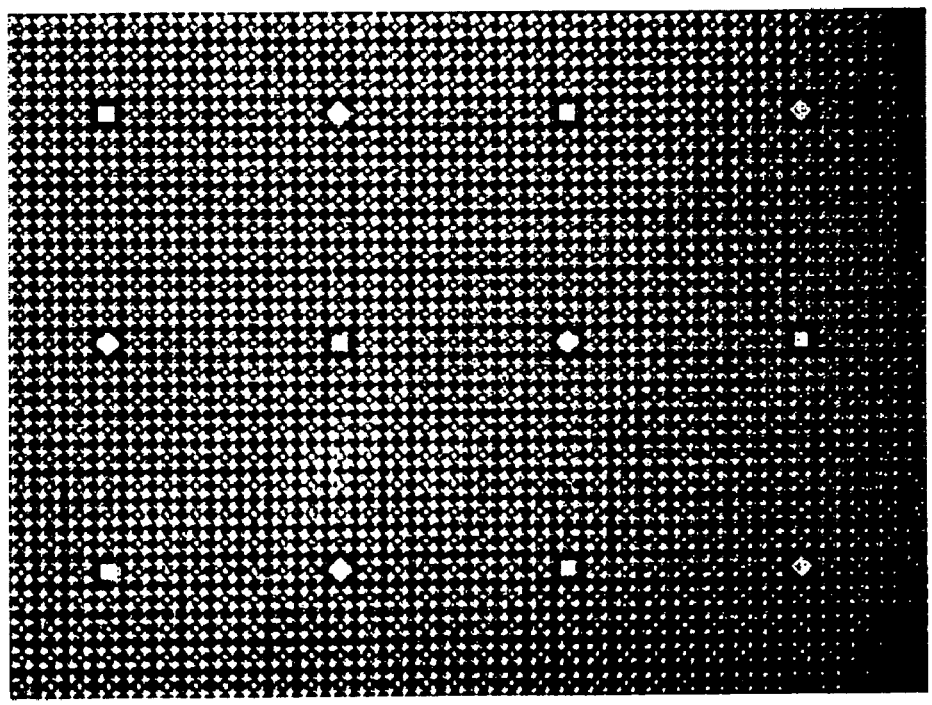
FIG. 19B is a schematic view showing an example of a reproduction image recorded on an element hologram of the hologram memory.

An example of a recording image is shown in FIG. 19A, and an example of a reproduction image is shown in FIG. 19B. The recording image exhibits an original brightness state of the two-dimensional image recorded on the element hologram. Meanwhile, the reproduction image is an image obtained when an image of the recording image is picked up by the image pickup device section 12.

As can be seen from FIGS. 19A and 19B, the recording image is formed as a set of binary values of light/dark pixels and do not include any intermediate gradation and therefore do not have a luminance dispersion. Accordingly, if an image of the recording image is picked up in an ideal tracking state by an ideal optical system, then the recording image itself of FIG. 19A is obtained as a reproduction image. Actually, however, an actual pickup image has such an optical dispersion and geometrical distortion as seen from the example of a reproduction image shown in FIG. 19B.

After the two-dimensional image signal is fetched into the information memory 31, the image division is executed at step F105. This image division is a process of dividing an image into sub blocks finding a clue in the two-dimensional synchronizing signals inserted regularly upon modulation. In particular, the image is divided in a unit of a group sub sync described hereinabove.

Figure 20:
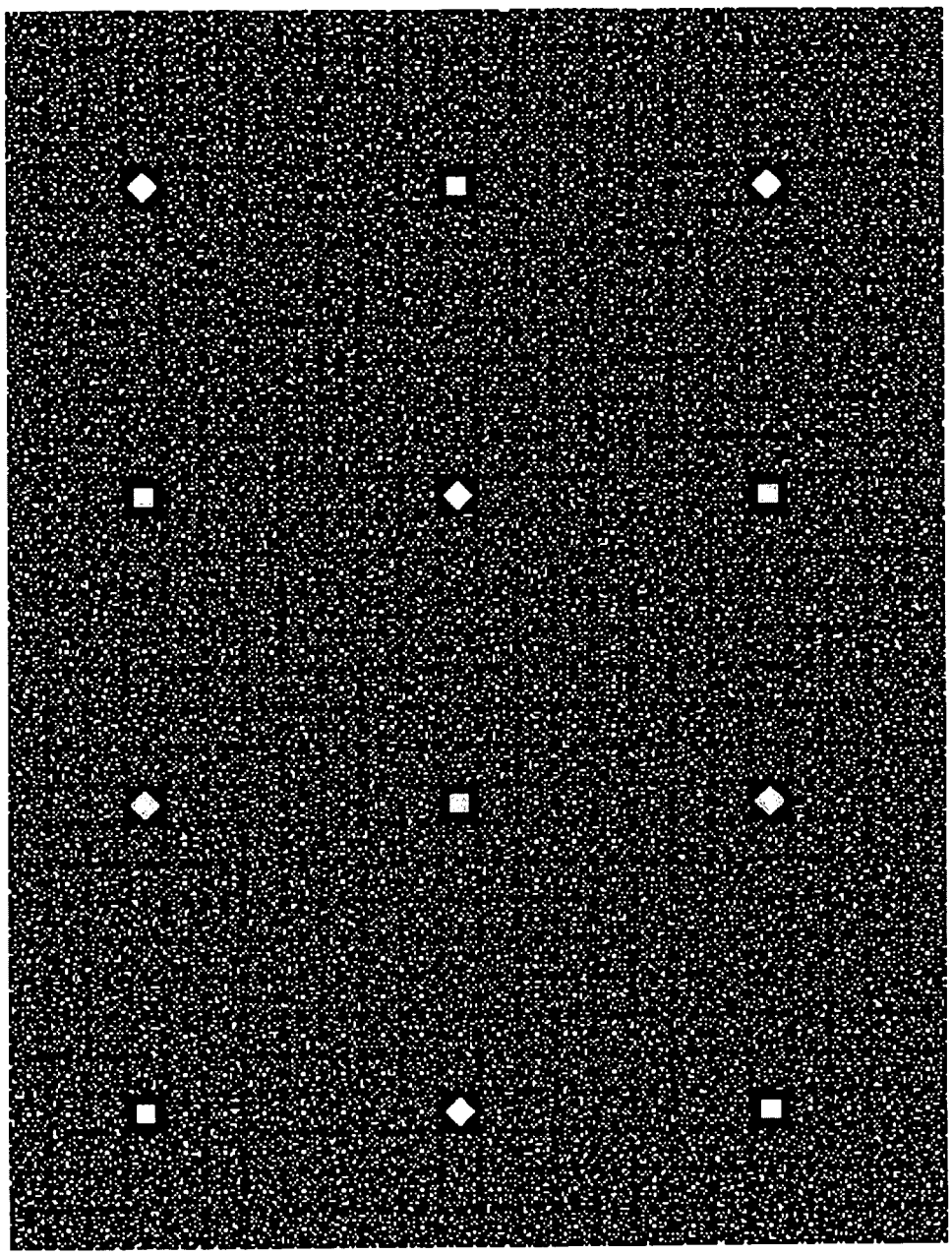
FIG. 20 is a schematic view showing another example of a recording image recorded on an element hologram of the hologram memory.
Figure 21:
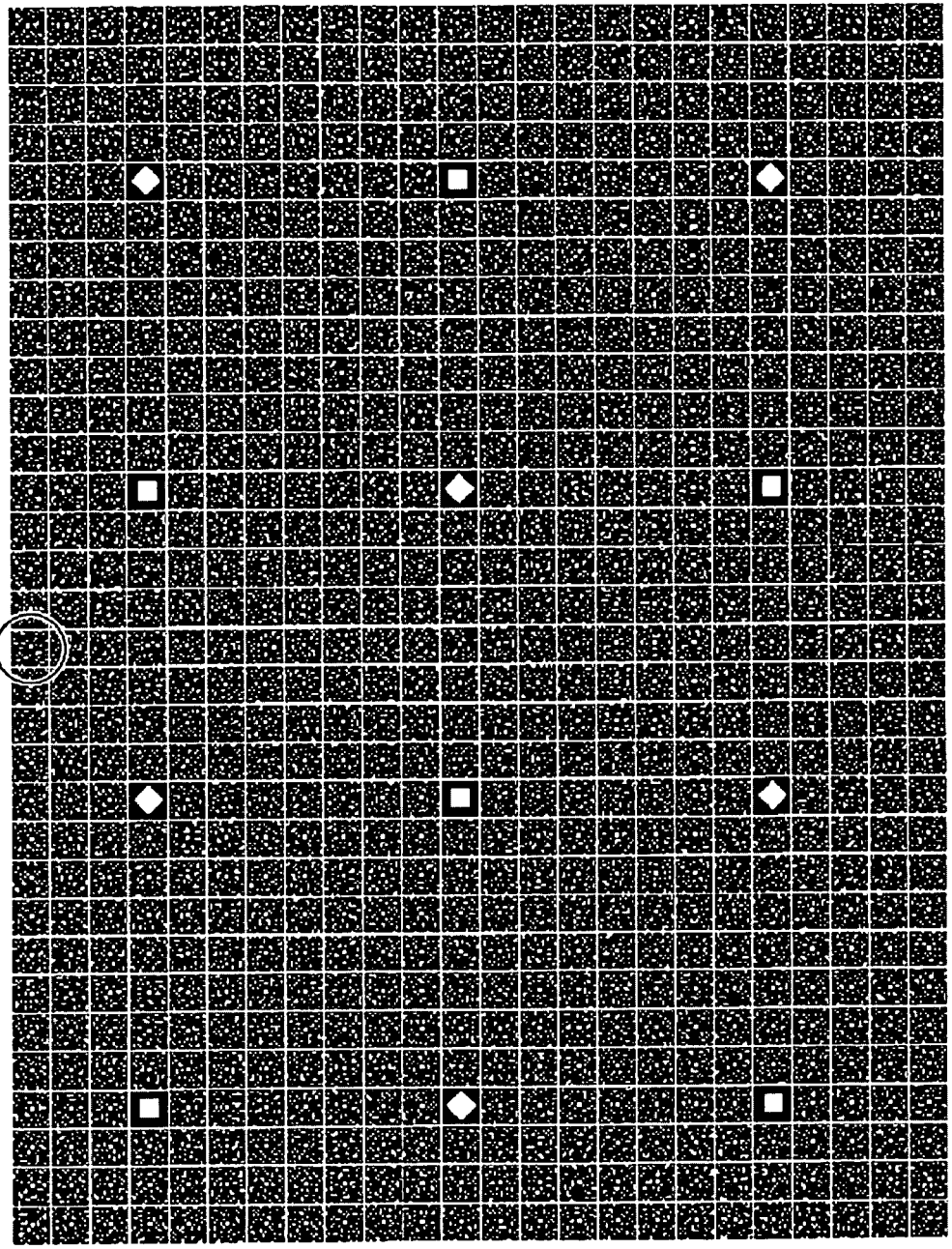

FIGS. 20, 21 and 22 illustrate a manner of image division. FIG. 20 shows an example of a recording image which is a two-dimensional image of 512×384 pixels. As described hereinabove, in the two-dimensional image, 32 group sub syncs are disposed in the horizontal direction, and 24 group sub syncs are disposed in the vertical direction.

FIG. 21 shows the example of the recording image of FIG. 20 in which a boundary is indicated in a unit of a group sub sync. In order to further facilitate understanding, in FIG. 22, the two-dimensional image is shown in a state wherein it includes only main synchronization symbols and sub sync patterns and a boundary is indicated in a unit of a group sub sync.

At step F105, the image is divided in a unit of a group sub sync in this manner. Later signal processing is performed in a basic unit of a group sub sync.

Then at steps F106 and F107, the geometrical distortion correction variable calculation/storage process and the optical correction variable calculation/storage process are performed in a unit of a group sub sync, respectively.

In particular, at step F106, a geometrical correction variable for each group sub sync is detected and stored as a geometrical correction variable calculated by the geometrical distortion correction variable calculation section 23 into the variable memory 26.

The geometrical correction variable may be a center coordinate value, an X-axis scale displacement, a Y-axis scale displacement, an angle displacement θ or the like of a sub sync pattern. However, for the simplified description, the following description is given principally in connection with a sub sync pattern center coordinate value assuming that any other displacement amount than the displacement amount of the sub sync pattern center coordinate value can be ignored.

While a manner in which an image is divided in a unit of a group sub sync and synchronization signals in the group sub syncs are illustrated in FIG. 22, the numbers 0 to 23 are applied to individual rows of the group sub syncs while the numbers 0 to 31 are applied to individual columns of the group sub syncs as seen in FIG. 22.

One sub sync pattern (or main synchronization pattern) exists in each of the 768 regions divided in a unit of a group sub sync in this manner. Here, since each group sub sync can be represented by one of the numbers (0, 0), . . . , (31, 23), the number is used to represent the center coordinate values X, Y of each sub sync pattern.

As the center coordinate value X for the sub sync patterns, the following 768 values

CENTX(0, 0), CENTX(1, 0), CENTX(2, 0), . . . , CENTX(30, 0), CENTX(31, 0)

CENTX(0, 1), CENTX(1, 1), CENTX(2, 1), . . . , CENTX(30, 1), CENTX(31, 1)

CENTX(0, 2), CENTX(1, 2), CENTX(2, 2), . . . , CENTX(30, 2), CENTX(31, 2)

. . .

CENTX(0, 22), CENTX(1, 22), CENTX(2, 22), . . . , CENTX(30, 22), CENTX(31, 22)

CENTX(0, 23), CENTX(1, 23), CENTX(2, 23), . . . , CENTX(30, 23), CENTX(31, 23)

are used.

Meanwhile, as the center coordinate value Y for the sub sync patterns, the following 768 values

CENTY(0, 0), CENTY(1, 0), CENTY(2, 0), . . . , CENTY(30, 0), CENTY(31, 0)

CENTY(0, 1), CENTY(1, 1), CENTY(2, 1), . . . , CENTY(30, 1), CENTY(31, 1)

CENTY(0, 2), CENTY(1, 2), CENTY(2, 2), . . . , CENTY(30, 2), CENTY(31, 2)

. . .

CENTY(0, 22), CENTY(1, 22), CENTY(2, 22), . . . , CENTY(30, 22), CENTY(31, 22)

CENTY(0, 23), CENTY(1, 23), CENTY(2, 23), . . . , CENTY(30, 23), CENTY(31, 23)

are used.

In short, 768 sets of center coordinate values are used as the geometrical correction variable.

The process at step S106 is described in detail with reference to FIG. 23A.

Figure 24:
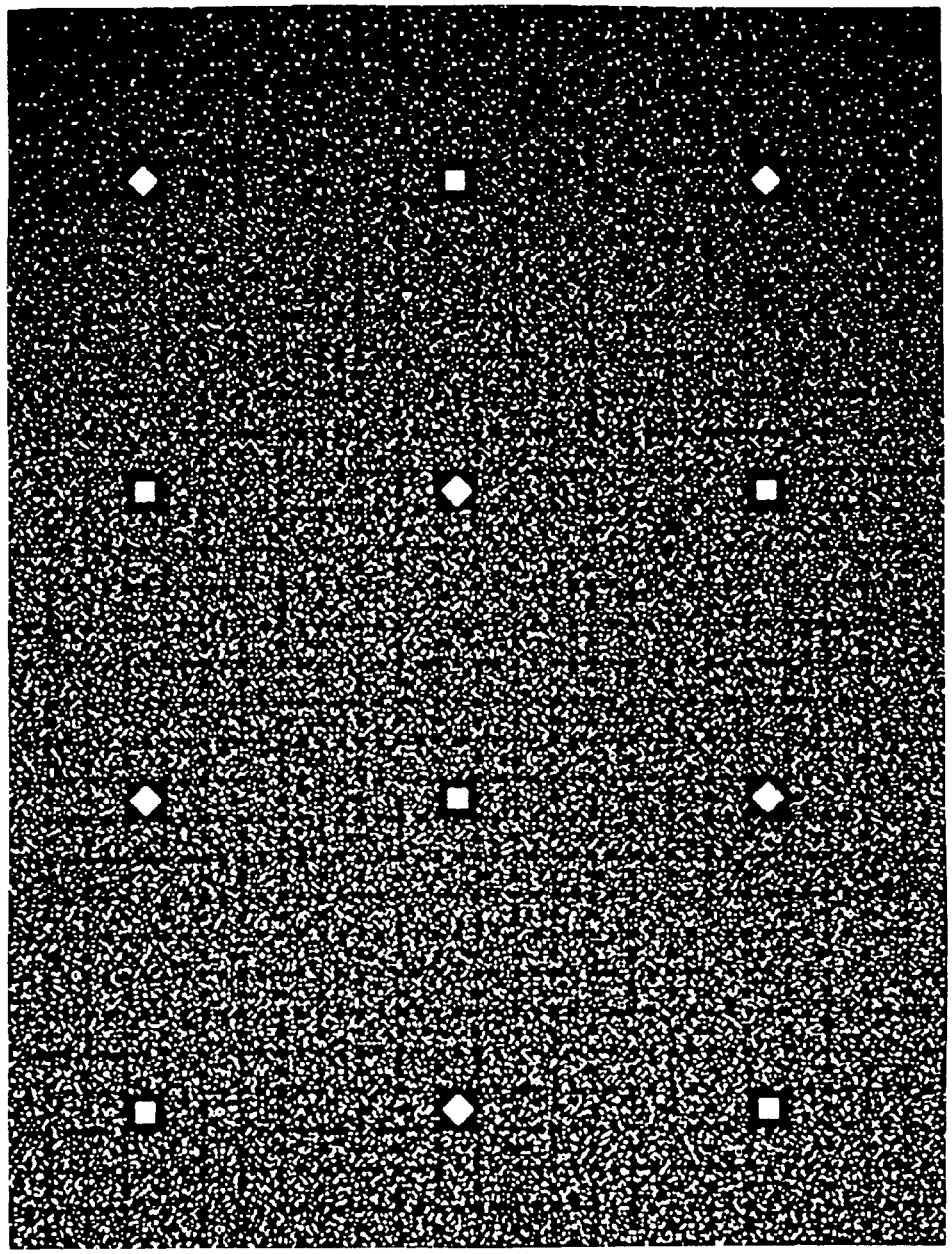
FIG. 24 is a schematic view showing an example of a reproduction image recorded on an element hologram of the hologram memory.

To the geometrical distortion correction variable calculation section 23, two-dimensional image signals stored in the information memory 31 are supplied. For example, such a two-dimensional image signal as that of an example of a reproduction image of FIG. 24 is supplied from the information memory 31 to the geometrical distortion correction variable calculation section 23.

The geometrical distortion correction variable calculation section 23 performs the geometrical distortion correction variable calculation for the two-dimensional image signal supplied thereto. In this instance, the geometrical distortion correction variable calculation section 23 first performs detection of a pattern of a main synchronization symbol at step F201 of FIG. 23A.

Since the main synchronization symbol has a special pattern which cannot appear in any normal group sub sync region, it can be detected readily from within the two-dimensional image signal. Further, there is no necessity to detect all main synchronization symbols in the two-dimensional image signals as hereinafter described.

In this process, for example, the main synchronization symbols MS(0, 0), . . . , MS(3, 2) shown in FIG. 11 are described.

Then at step F202, temporary calculation of the geometrical correction variable is performed. In particular, the geometrical distortion correction variable calculation section 23 performs a process of estimating the center coordinate values X, Y of a sub sync pattern from the center coordinate values of the main synchronization symbol detected at step F201.

First, the main synchronization symbols and the variables i, j illustrated in FIG. 11 correspond in the following manner using the numbers of the group sub sync units applied in FIG. 22 in the horizontal and vertical directions:

MS(0, 0): coordinate coordinates (i, j)=(3, 3)
MS(1, 0): coordinate coordinates (i, j)=(11, 3)
MS(2, 0): coordinate coordinates (i, j)=(19, 3)
MS(3, 0): coordinate coordinates (i, j)=(27, 3)
MS(0, 1): coordinate coordinates (i, j)=(3, 11)
MS(1, 1): coordinate coordinates (i, j)=(11, 11)
MS(2, 1): coordinate coordinates (i, j)=(19, 11)
MS(3, 1): coordinate coordinates (i, j)=(27, 11)
MS(0, 2): coordinate coordinates (i, j)=(3, 19)
MS(1, 2): coordinate coordinates (i, j)=(11, 19)
MS(2, 2): coordinate coordinates (i, j)=(19, 19)
MS(3, 2): coordinate coordinates (i, j)=(27, 19)

Now, if the number of image pickup pixels per one element of a sub sync pattern is m pixels×n pixels in the horizontal/vertical directions and there exists no geometrical distortion, then the center coordinate values X and Y are represented as $CENTX(i, j) = 8 \cdot m + 16 \cdot m \cdot i = 8 \cdot m \cdot (1 + 2 \cdot i)$
$CENTY(i, j) = 8 \cdot n + 16 \cdot n \cdot j = 8 \cdot n \cdot (1 + 2 \cdot j)$ where
$0 \leq i \leq 31$
$0 \leq j \leq 23$ For example, if the image pickup pixel number per one element of a sub sync pattern is 2 pixels×2 pixels in the horizontal/vertical directions, then $CENTX(i, j) = 16 \cdot (1 + 2 \cdot i)$
$CENTY(i, j) = 16 \cdot (1 + 2 \cdot j)$ where
$0 \leq i \leq 31$
$0 \leq j \leq 23$ Accordingly, if no geometrical distortion exists, then the center coordinate values exhibit the following ideal values:

MS(0, 0): CENTX(3, 3)=112, CENTY(3, 3)=112
MS(1, 0): CENTX(11, 3)=368, CENTY(11, 3)=112
MS(2, 0): CENTX(19, 3)=624, CENTY(19, 3)=112
MS(3, 0): CENTX(27, 3)=880, CENTY(27, 3)=112
MS(0, 1): CENTX(3, 11)=112, CENTY(3, 11)=368
MS(1, 1): CENTX(11, 11)=368, CENTY(11, 11)=368
MS(2, 1): CENTX(19, 11)=624, CENTY(19, 11)=368
MS(3, 1): CENTX(27, 11)=880, CENTY(27, 11)=368
MS(0, 2): CENTX(3, 19)=112, CENTY(3, 19)=624
MS(1, 2): CENTX(11, 19)=368, CENTY(11, 19)=624
MS(2, 2): CENTX(19, 19)=624, CENTY(19, 19)=624
MS(3, 2): CENTX(27, 19)=880, CENTY(27, 19)=624

In this manner, the center coordinate values of the sub sync patterns are estimated from the center coordinate values of the main synchronization symbols. In other words, a geometrical correction variable is temporarily calculated and determined as a temporary geometrical correction variable.

However, since geometrical distortion actually appears, a difference appears between an actual detection value and a corresponding ideal value given hereinabove. The other sub sync pattern center coordinate values are temporarily calculated taking the difference into consideration.

Further, even if not all main synchronization symbols are detected, the center coordinate values of any main synchronization symbol which has not been detected successfully may be determined by interpolation from the center coordinate values of those main synchronization symbols which have been detected successfully.

However, there is the possibility that the sync pattern center coordinate values temporarily calculated based on the center coordinate values of a main synchronization symbol determined by interpolation may have a greater error than the sub sync pattern center coordinate values temporarily calculated based on the center coordinate values of those main synchronization symbols which are detected normally.

Figure 25:
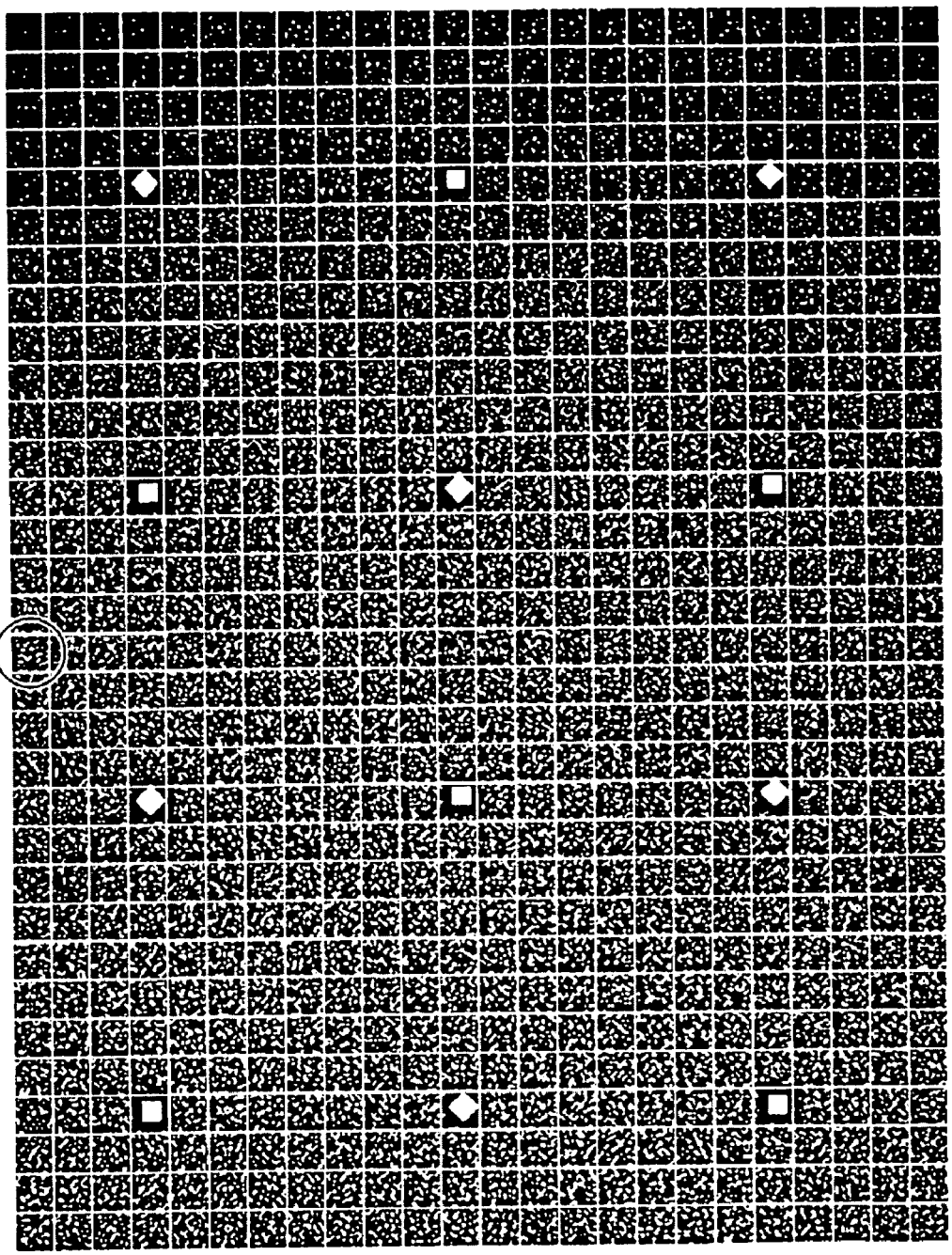
FIG. 25 is a view showing a reproduction image re-configured based on temporarily calculated parameters by the hologram reader.

FIG. 25 shows a reproduction image re-constructed based on the geometrical correction variables temporarily calculated in such a manner as described above. A sub sync pattern or a main synchronization symbol of each group sub sync is accommodated roughly in boundary lines of the group sub sync unit.

While, in FIG. 25, an image after the temporary calculation of the geometrical correction variable is re-constructed based on the sub sync pattern center coordinate values, image re-construction which involves a large number of image data accesses is not performed actually.

In other words, at step F203, the temporarily calculated sub sync pattern center coordinate values are just stored as temporary geometrical correction variables into the variable memory 26.

This signifies that, although it is necessary to read out two-dimensional image data from the information memory 31, there is no necessity to perform writing into the information memory 31 through re-construction of two-dimensional image data from the calculated temporary geometrical correction variables.

Further, also as regards readout of two-dimensional image data from the information memory 31, there is no necessity to read out all pixels. In particular, if a main synchronization symbol position is estimated to some degree and only those pixels which are positioned around the estimated main synchronization symbol position are read out, then the access amount of image data can be further reduced.

Here, a recording image and a reproduction image after the temporary geometrical correction variable calculation are compared with each other taking a group sub sync GSS1 shown in FIGS. 21 and 25 as an example.

Figure 26B:
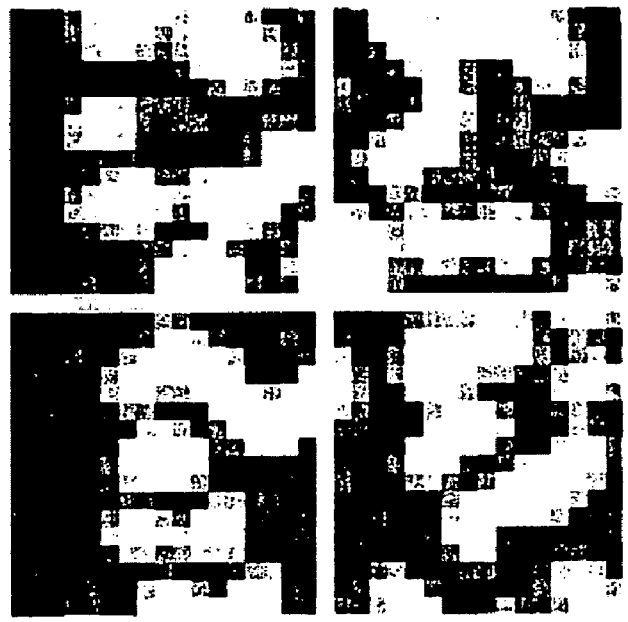
FIG. 26B is a diagrammatic view showing an example of a reproduction image after temporary calculation by the hologram reader.
Figure 26A:
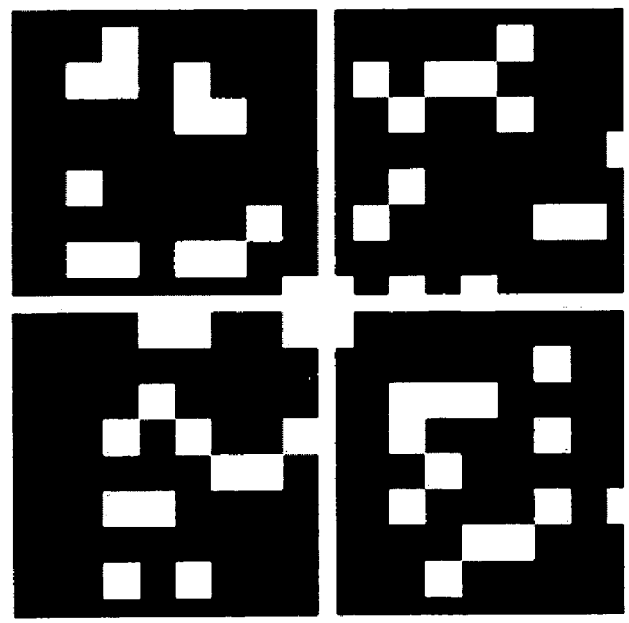
FIG. 26A is a diagrammatic view showing an example of a recording image recorded on the hologram memory.

FIG. 26A shows an example of a recording image of the group sub sync GSS1 recorded originally, and FIG. 26B shows an example of a reproduction image of the group sub sync GSS1 in the state of FIG. 25. It is to be noted that, in FIGS. 26A and 26B, the center position is indicated by crossing lines on the image example.

In the recording image example of FIG. 26A, a sub sync pattern formed from the white level of 2×2 pixels is positioned at the center of the symbol. However, in the reproduction image example of FIG. 26B, the position of the sub sync pattern is displaced a little rightwardly downwards from the center of the symbol because of geometrical distortion.

Figure 23B:
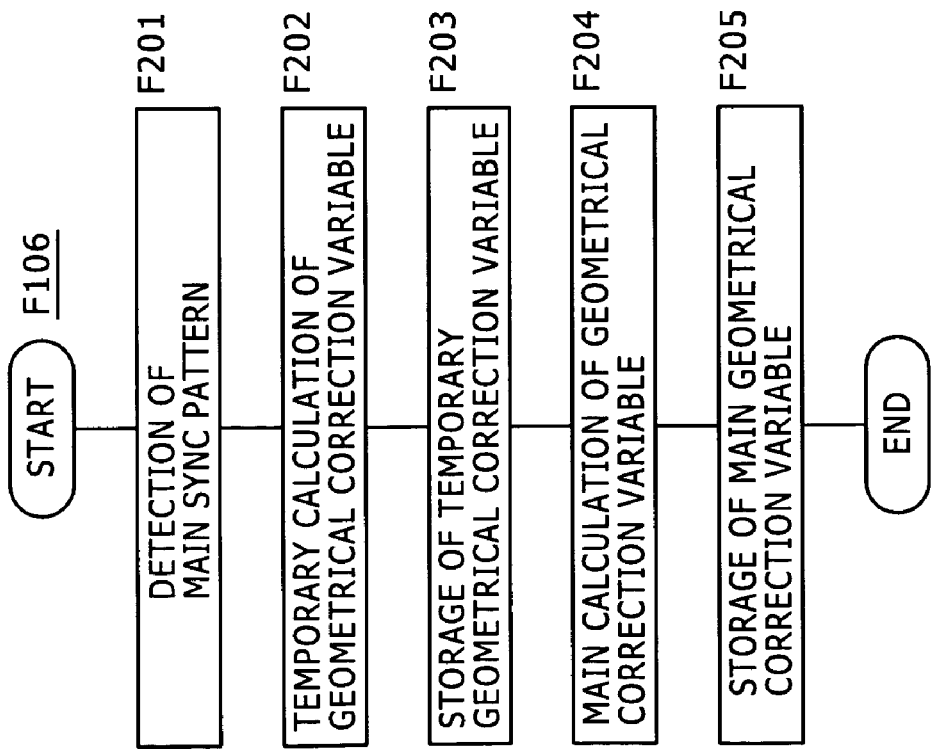
FIG. 23B is a flow chart illustrating an optical distortion correction process in the reproduction process.
Figure 23A:
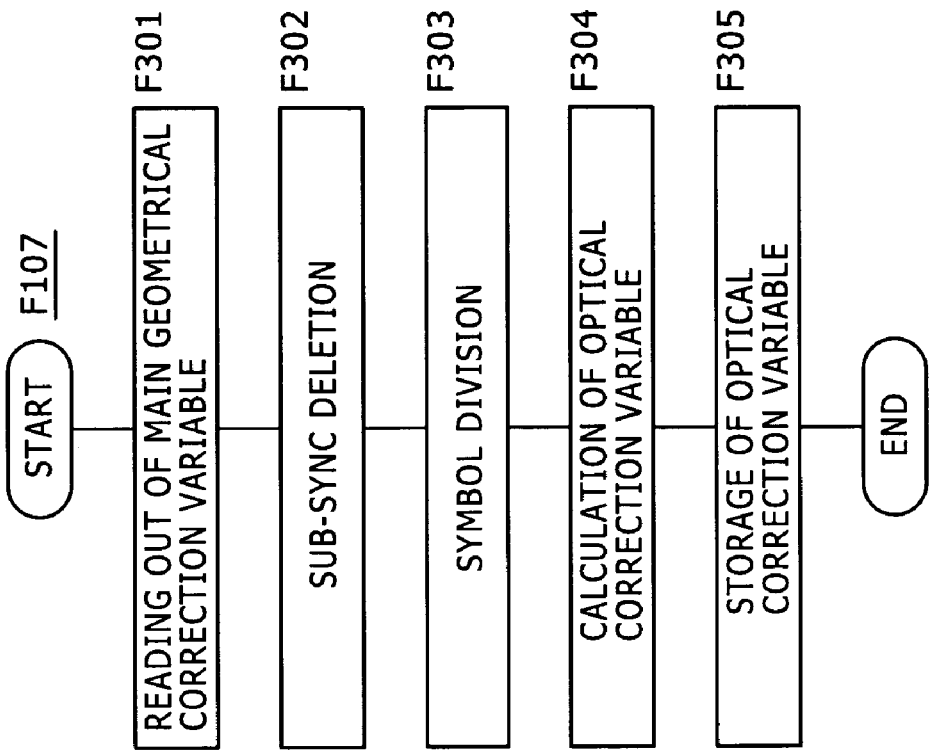
FIG. 23A is a flow chart illustrating a geometrical distortion correction process in the reproduction process.

At step F204 of FIG. 23A, as a main calculation process of the geometrical correction variable, correction of the sub sync pattern center coordinate values is performed so that the displacement amount of the sub sync pattern described above may be minimized.

A result (after the main geometrical correction variable calculation) of the correction of the group sub sync GSS1 of FIG. 26B is shown in FIG. 27B. It is to be noted that FIG. 27A shows a recording image shown for comparison similarly to FIG. 26A. In FIG. 27B, the sub sync pattern in the group sub sync GSS1 is corrected so that it is positioned at the center of the symbol.

Figure 28:
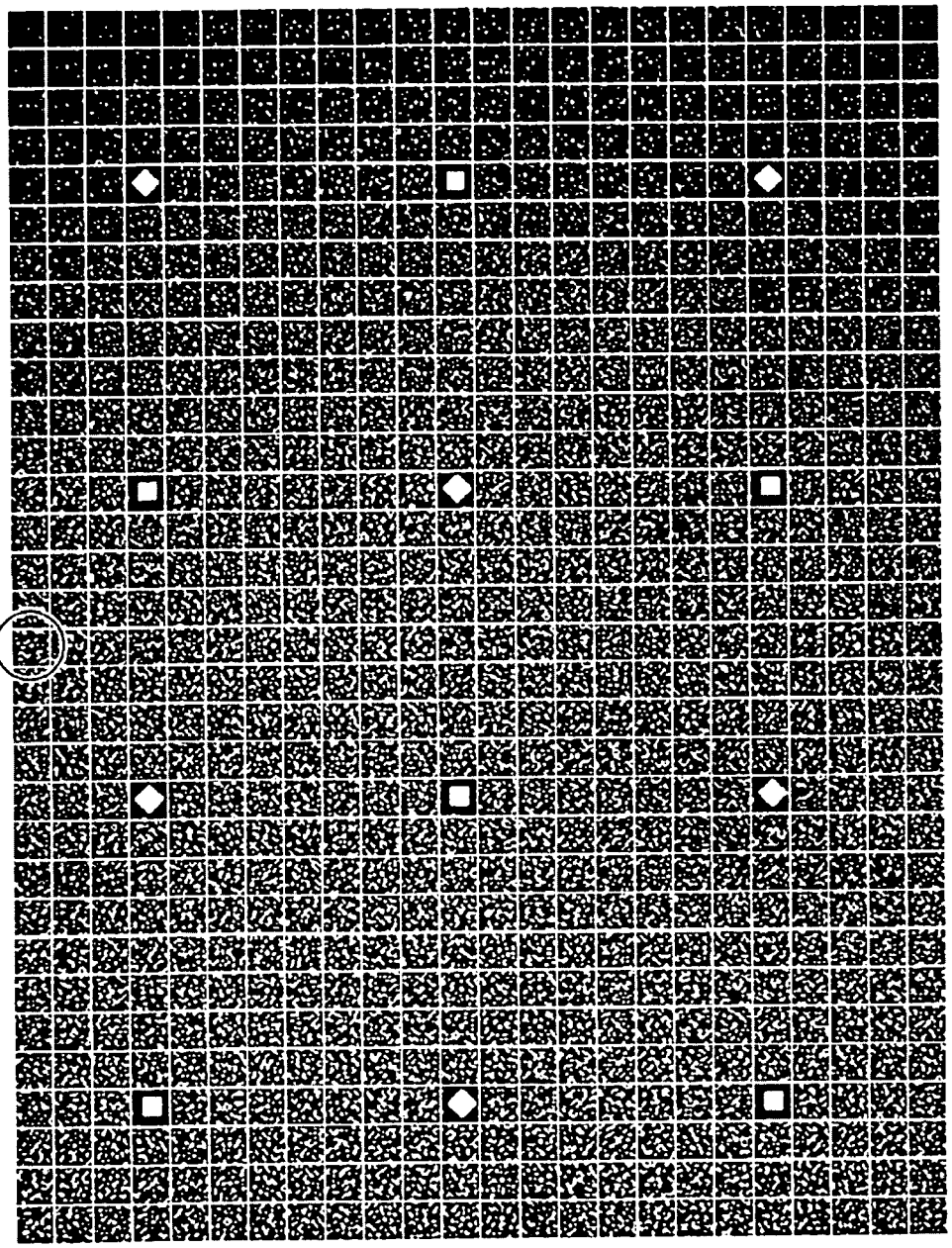
FIG. 28 is a schematic view showing a reproduction image re-configured based on main calculation parameters by the hologram reader.

Meanwhile, FIG. 28 shows a reproduction image re-constructed based on the calculated main geometrical correction variable. It can be seen in FIG. 28 that the sub sync pattern in the group sub sync displaced delicately in FIG. 25 is corrected so as to be positioned at the center and geometrically the reproduction image is proximate to the recording image of FIG. 21.

Correction of the center coordinate values of a sub sync pattern in a group sub sync region is performed in this manner, and the center coordinate values are determined as the main geometrical correction variable. Then, also in this instance, there is no necessity to re-construct a reproduction image by a signal process similarly as at step F203, but only it is necessary to store the sub sync pattern center coordinate values as the main geometrical correction variable into the variable memory 26 at step F205.

Now, the optical distortion correction variable calculation/storage process performed at step F107 of FIG. 14 is described.

At step F107, a process of calculating an optical correction variable for each group sub sync region as an optical correction variable to be calculated by the optical correction variable calculation section 22 and storing the calculated optical correction variable is performed.

The optical correction variable may be a luminance sum value. In the present image example, the following totaling 768 luminance sum values are used:

SUM_L(0, 0), SUM_L(1, 0), SUM_L(2, 0), . . . , SUM_L(30, 0), SUM_L(31, 0)

SUM_L(0, 1), SUM_L(1, 1), SUM_L(2, 1), . . . , SUM_L(30, 1), SUM_L(31, 1)

SUM_L(0, 2), SUM_L(1, 2), SUM_L(2, 2), . . . , SUM_L(30, 2), SUM_L(31, 2)

. . .

SUM_L(0, 22), SUM_L(1, 22), SUM_L(2, 22), . . . , SUM_L(30, 22), SUM_L(31, 22)

SUM_L(0, 23), SUM_L(1, 23), SUM_L(2, 23), . . . , SUM_L(30, 23), SUM_L(31, 23)

It is to be noted that, in the case of the geometrical correction variable described above, since the ground of the processing is the sub sync pattern, the processing unit cannot be set smaller than a group sub sync region. However, since the fact is utilized that the number of white level pixels in a symbol formed from 4×4 pixels except the sub sync pattern is restricted (in the example described, to three pixels), the luminance sum value which is an optical correction variable may be detected and stored for each symbol. In this instance, the following totaling 3,072 (64 [horizontal]×48 [vertical]) luminance sum values should be used:

SUM_L(0, 0), SUM_L(1, 0), SUM_L(2, 0), . . . , SUM_L(126, 0), SUM_L(127, 0)

SUM_L(0, 1), SUM_L(1, 1), SUM_L(2, 1), . . . , SUM_L(126, 1), SUM_L(127, 1)

SUM_L(0, 2), SUM_L(1, 2), SUM_L(2, 2), . . . , SUM_L(126, 2), SUM_L(127, 2)

SUM_L(0, 94), SUM_L(1, 94), SUM_L(2, 94), . . . , SUM_L(126, 94), SUM_L(127, 94)

SUM_L(0, 95), SUM_L(1, 95), SUM_L(2, 95), . . . , SUM_L(126, 95), SUM_L(127, 95)

The process at step F107 is illustrated in detail in FIG. 23B.

Referring to FIG. 23B, first at step F301, reading out of the main geometrical correction variables is performed. Here, the main geometrical correction variables stored into the variable memory 26 by the process at step F205 described hereinabove are read out. Then, group sub syncs of 16 pixels×16 pixels centered at the coordinates indicated by the main geometrical correction variables are read out from the information memory 31.

At this point of time, reproduction images corresponding to FIG. 27B are obtained by the optical correction variable calculation section 22.

Figure 29B:
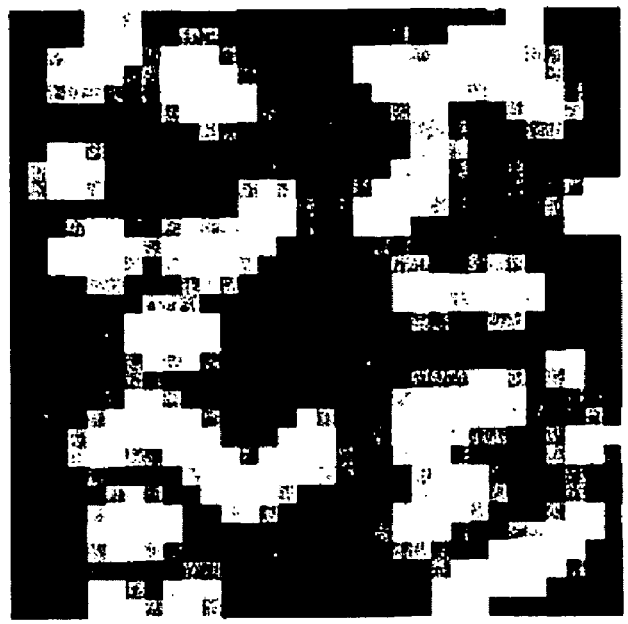
FIG. 29B is a diagrammatic view showing an example of a reproduction image after the sub sync deletion by the hologram reader.
Figure 29A:
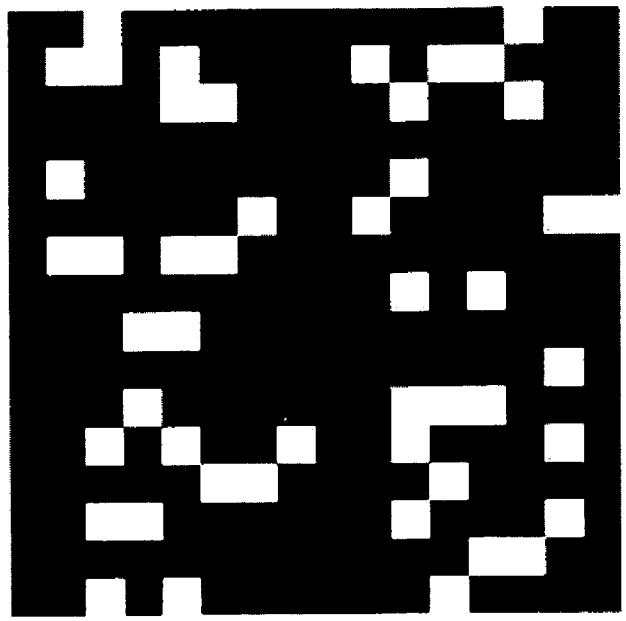
FIG. 29A is a diagrammatic view showing an example of a recording image after sub sync deletion by the hologram reader.

Then at step F302, the sub sync patterns are deleted. Since the sub sync patterns are not necessary any more after the geometrical correction described above comes to an end, the black level is inserted into the regions corresponding to the sub sync patterns. As a result, such reproduction images as shown in FIG. 29B are obtained. It is to be noted that FIG. 29A shows a recording image for comparison.

Figure 30B:
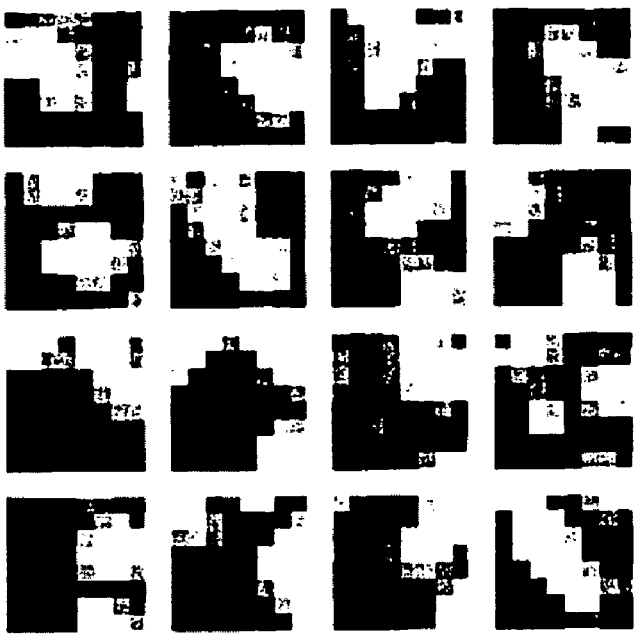
FIG. 30B is a diagrammatic view showing an example of a reproduction image after symbol division by the hologram reader.
Figure 30A:
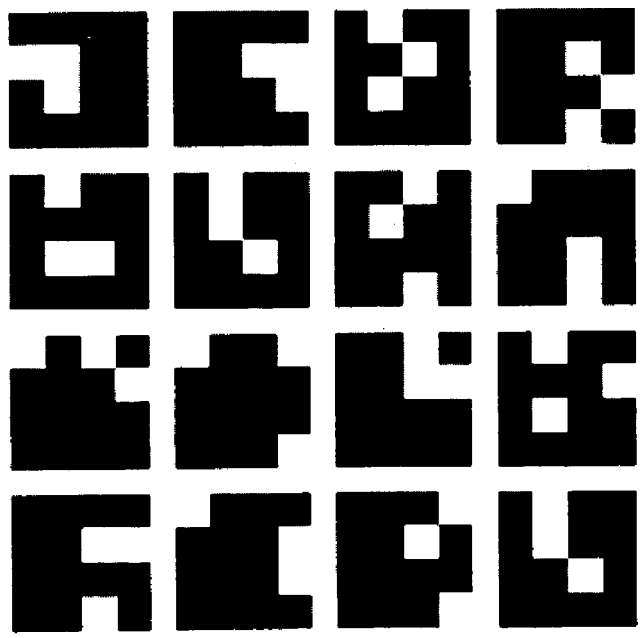
FIG. 30A is a diagrammatic view showing an example of a recording image after symbol division by the hologram reader.

Then, symbol division is performed at step F302. Here, each group sub sync is divided into 16 two-dimensional symbols (4×4 pixels). As a result, a reproduction image of FIG. 30B is obtained. It is to be noted that FIG. 30A shows a group sub sync of a recording image divided into 16 two-dimensional symbols for comparison.

Then at step F304, an optical correction variable is calculated. For example, the luminance sum value of all pixels is calculated for each of the divided two-dimensional symbol units to generate an optical correction variable. In short, the luminance sum values SUML_(0, 0), . . . , SUM_L(127, 95) described hereinabove are calculated.

It is to be noted that, where the luminance sum values SUML_(0, 0), . . . , SUM_L(31, 23) are calculated in a unit of a group sub sync, the symbol division process at step F303 is unnecessary.

Finally at step F305, the calculated luminance sum values are stored as optical correction variables into the variable memory 26, and the optical distortion correction process, that is, the process at step F107 of FIG. 14, is completed.

Figure 31:
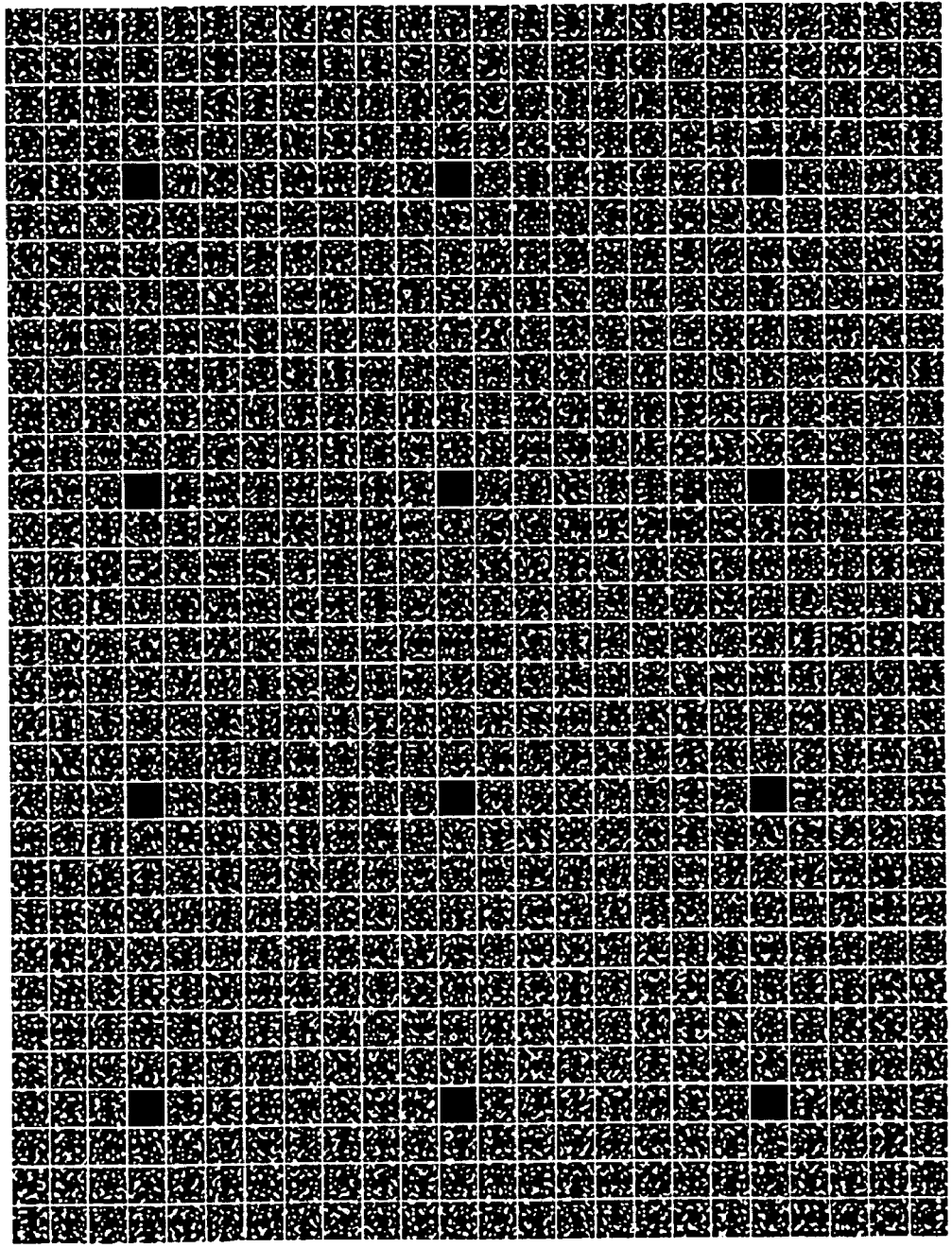
FIG. 31 is a schematic view showing a corrected image by the hologram reader.

FIG. 31 shows an optically corrected image. This image is a reproduction image re-constructed based on the main geometrical correction variables and the optical correction variables stored in the variable memory 26.

Actually, image re-construction which involves a large number of image data accesses is not performed, but the main geometrical correction variables and the optical correction variables are referred to in the binarization process at next step F108 of FIG. 14.

In the binarization process at step F108 of FIG. 14, the binarization section 24 fetches the two-dimensional image from the information memory 31. Since actual image re-construction is not performed at step F106 or F107, the two-dimensional image stored in the information memory 31 at this point of time remains in a state wherein it is fetched at step F104, that is, in a state wherein it includes geometrical distortion and optical distortion.

At this time, the binarization section 24 first determines a pixel address to be read out from the information memory 31 based on the geometrical correction variables (main geometrical correction variables) stored in the variable memory 26. As a result, the binarization section 24 can fetch a two-dimensional image signal in a state of FIG. 28 whose geometrical distortion is corrected.

Then, the binarization section 24 binarizes the two-dimensional image signal fetched therein. This is because, although the recording image has binary levels of white/black (light/dark), the two-dimensional image signal picked up by the image pickup device section 12 includes intermediate levels between the binary levels.

At this time, a threshold value for the binarization, that is, a reference value for the binarization process, is set based on the optical correction variables stored in the variable memory 26. For example, a binarization threshold value is set for each group sub sync unit or a unit of a two-dimensional symbol of 4×4 pixels in accordance with the optical correction variables (luminance sum values) stored in a unit of a group sub sync or in a unit of a two-dimensional symbol of 4×4 pixels. Then, the individual pixel levels are binarized into the light level and the dark level. Consequently, the two-dimensional image signal as a result of the binarization becomes a binary signal which is in a state wherein its optical distortion is corrected, that is, which corresponds to the state of FIG. 31.

After such a binarization process as described above is completed, the processing of FIG. 14 enters the decoding step Fc. In the decoding step Fc, a decoding process at step F109 and a scanning completion decision process at step F110 are performed.

At step F109, the two-dimensional image signal binarized by the binarization section 24 is supplied to the decoding section 25, and the decoding section 25 performs a decoding process including demodulation, error correction and so forth. Consequently, reproduction data are regenerated. The decoded data, that is, the reproduction data reproduced from one element hologram on the hologram memory 3, are stored into the nonvolatile memory 32 by the memory controller 21.

At step F110, it is decided whether or not a required amount of element holograms is reproduced successfully. If such reproduction is completed, then the scanning is ended. At this time, the system controller 51 controls the reference light source 16 to end the irradiation of the reproduction reference light L4.

On the other hand, if a required amount of element holograms is not reproduced successfully, then the processing returns to step F101 to repeat the processes described above. In other words, the reproduction process for the other element holograms is successively executed similarly.

It is to be noted that, where the hologram reader 6 is constructed not for manual scanning but for the camera control at step F103, when the processing returns from step F110 to step F101, the optical conditions such as the reference light intensity, angle and so forth and the positional relationship between the element hologram and the image pickup device are adjusted and simultaneously a pixel whose SN (Signal Noise) characteristic is favorable upon reading is estimated and selected based on the optical correction variables and the geometrical correction variables. Then, only the selected pixel is read in. This can enhance the image pickup speed and the SN characteristic upon reading.

Upon completion of the process of FIG. 14 described above, a state is established wherein data read out from the element holograms of the hologram memory 3 are stored in the nonvolatile memory 32. Consequently, such reproduction data as, for example, AV content data are constructed in the nonvolatile memory 32.

The reproduction data are thereafter transferred to the external apparatus 100 through the external interface 41 so that the user can use the reproduction data on the external apparatus 100.

5. Effects of the Invention

The following effects can be achieved by the embodiment described above.

Data can be reproduced from element holograms recorded on the hologram memory 3, for example, in the form of a sheet by the hologram reader 6 of the embodiment which includes the image pickup section 10, memory section 30 and signal processing section 20.

Where the hologram scan control section 15 is mounted in the image pickup section 10 in addition to the image pickup device section 12 (and the camera control mechanism section 13), a popular camera module can be utilized to implement a hologram data reproduction function. Consequently, facilitation in design and manufacture and reduction in cost can be anticipated.

Since the signal processing section 20 has the optical correction variable calculation section 22, geometrical distortion correction variable calculation section 23, binarization section 24, variable memory 26 and memory controller 21 incorporated therein, image processing necessary for implementation of the hologram data reproduction function can be achieved.

Further, the memory section 30 includes the information memory 31 formed typically from a DRAM suitable to high speed sequential accessing for storing a two-dimensional image and the nonvolatile memory 32 of a large capacity for storing reproduction data outputted from the decoding section 25. Further, the memory section 30 has the variable memory 26 incorporated therein which is suitable for high speed random accessing. Consequently, a hologram recording process wherein a large amount of data is decoded at a high speed and with a small amount of arithmetic operation can be achieved.

It is to be noted that, if one or both of the information memory 31 and the nonvolatile memory 32 are replaced by a memory provided in an existing reproduction apparatus, then the hologram reproduction function can be implement without provision of an additional memory.

Further, in the element tracking process Fa of FIG. 14, a partial two-dimensional image is fetched and a tracking state with regard to an element hologram is decided from the partial two-dimensional image. Consequently, the tracking state can be decided at a speed much higher than that at which the tracking state is decided from the entire two-dimensional image. Then, at a timing at which a good tracking state is detected while the tracking state is decided at a high speed, the entire two-dimensional image of the element holograms is fetched. Consequently, a two-dimensional image suitable for data reproduction can be fetched. Therefore, the S/N characteristic upon reading of a two-dimensional image can be enhanced and a reproduction performance of a high degree of accuracy can be implemented.

The hologram scan control section 15 can read out arbitrary pixels in an arbitrary order at an arbitrary timing. Consequently, the accuracy in element tracking can be enhanced.

Further, data successively read out from the element holograms and decoded are cumulatively stored into the nonvolatile memory 32, and finally, the reproduction data from the element holograms are re-constructed in the nonvolatile memory 32 to form reproduction data such as content data. This signifies that the element holograms in the hologram memory 3 may be read out in an arbitrary order. Accordingly, there is no problem even if the element holograms are read out at random by manual scanning described hereinabove with reference to FIGS. 2A and 2B. Also when the scanning position is variably controlled successively by the camera control mechanism section 13, the degree of freedom in the variable controlling action can be enhanced. This makes it to perform, in the element tracking process Fa, image pickup and decoding processes of a two-dimensional image of a certain element hologram if the decision of tracking OK is made with regard to the element hologram without particularly relying upon a particular order. In other words, such control as to detect or establish the state of tracking OK successively in a particular order with regard to the individual element holograms is not required, and difficult tracking control need not be executed. From this, facilitation and improvement in efficiency of the reproduction process can be implemented.

Further, the geometrical distortion correction variable calculation section 23 and the optical correction variable calculation section 22 calculate correction variables for geometrical correction, optical correction and so forth with regard to two-dimensional images stored in the information memory 31 and store the calculated correction variables into the variable memory 26. Then, the binarization section 24 performs a binary process using the correction variables stored in the variable memory 26 to obtain binary data for which geometrical distortion correction and optical correction have been performed. Then, the binary data are decoded by the decoding section 25 to obtain reproduction data. This does not involve correction processes such as geometrical distortion correction and optical correction which are successively performed directly for any two-dimensional image stored in the information memory 31. Therefore, also writing of a two-dimensional image after the correction processes into the information memory 31, that is, updating of a two-dimensional image to a corrected two-dimensional image in the information memory 31, is not performed either. Accordingly, also the burden of the accessing process to the information memory 31 necessary to successively perform the geometrical distortion correction and the optical distortion correction and the burden on the processing time by the accessing process can be eliminated. Consequently, significant enhancement of the efficiency in the reproduction process can be implemented.

Further, since no correction process is performed for a two-dimensional image itself before information decoding by the binarization section 24 and the decoding section 25 is executed, also an advantage of suppression of an arithmetic operation error involved in the correction can be achieved.

From those, effects of reading out of a large amount of information from a hologram recording medium, a high speed reproduction process and acquisition of reproduction information of high quality can be implemented.

Further, at step F103 in the course of returning of the processing from step F110 to step F101 of FIG. 14, the hologram scan control section 15 estimates a mechanical image pickup state, which exhibits a favorable SN characteristic upon reading, based on the optical correction variables and the geometrical correction variables stored in the variable memory 26, and controls the camera control mechanism section 13 to the estimated state. Consequently, the SN characteristic upon image reading can be improved.

Further, the hologram scan control section 15 estimates and selects a pixel region, which exhibits a favorable SN characteristic upon reading, based on the optical correction variables and the geometrical correction variables stored in the variable memory 26. Then, the hologram scan control section 15 reads in the selected pixel region by the partial image pickup at step F101. Consequently, the image pickup speed and the SN characteristic upon reading can be improved.

According to the embodiment of the present invention, data can be reproduced from element holograms recorded on a hologram recording medium typically in the form of a sheet by means of a reproduction apparatus which includes an image pickup section, a memory section and a signal processing section.

In this instance, a partial two-dimensional image is fetched by a partial image pickup process (partial image pickup step), and a tracking state with regard to an element hologram is decided from the partial two-dimensional image. Consequently, the tracking state can be decided at a speed much higher than that at which the tracking state is decided from the entire two-dimensional image. Further, at a timing at which a favorable tracking state is detected while the tracking state is decided at a high speed, the entire two-dimensional image of the element hologram is fetched. Consequently, a two-dimensional image suitable for data reproduction can be fetched. Therefore, the reproduction performance can be enhanced.

While a preferred embodiment of the present invention has been described using specific terms, such processing procedures and patterns as are described in the embodiment are mere examples at all, and it is to be understood that changes and variations may be made without departing from the spirit or scope of the following claims.

The invention claimed is:

1. A reproduction apparatus capable of reproducing, from a hologram recording medium on which digital data are recorded as an element hologram formed from interference fringes generated by interference of imaged data of the digital data as object light with reference light, the digital data, comprising:

image pickup means for picking up an image of the element hologram as a two-dimensional image;

storage means for storing the two-dimensional image picked up by said image pickup means;

partial extraction means for extracting a predetermined region of the two-dimensional image picked up by said image pickup means, the predetermined region having stored therein a synchronization signal of data of a form different from that of data produced by performing a predetermined modulation process for the digital data, the digital data being converted into two-dimensional code symbols by dividing the digital data into blocks for each predetermined data amount and performing a predetermined modulation process for the blocks, and the synchronization signal has a data amount equal to that of plural ones of the two-dimensional code symbols;

decision means for deciding a tracking state with regard to the element hologram from the two-dimensional image extracted by said partial extraction means;

image fetching processing means for fetching, where it is decided by said decision means that the two-dimensional image picked up by said image pickup means can be fetched, the two-dimensional image picked up by said image pickup means into said storage means;

signal processing means for performing signal processing for the two-dimensional image stored in said storage means to reproduce the digital data; and control means for controlling said partial extraction means, decision means, image fetching means and signal processing means to extract the predetermined region from the two-dimensional image picked up by said image pickup means, decide the tracking state of the element hologram from the extracted two-dimensional image, fetch the two-dimensional image picked up by said image pickup means into said storage means based on the result of the decision and reproduce the digital data from the two-dimensional image stored in said storage means.

2. The reproduction apparatus according to claim 1, wherein, where the synchronization signal is detected in the region extracted by said partial extraction means, said decision means decides that the two-dimensional image picked up by said image pickup means can be fetched.

3. The reproduction apparatus according to claim 1, wherein a plurality of such synchronization signals are recorded on the hologram recording medium, and said reproduction apparatus can fetch the two-dimensional image when at least one of the plural synchronization signals is reproduced.

4. The reproduction apparatus according to claim 1, wherein the synchronization signal has a form different from that of an adjacent synchronization signal.

5. The reproduction apparatus according to claim 1, further comprising correction means for correcting the picked up two-dimensional image, and wherein the two-dimensional image picked up by said image pickup means is corrected by said correction means based on the two-dimensional image of the extracted predetermined region.

6. A reproduction method for reproducing, from a hologram recording medium on which digital data are recorded as an element hologram formed from interference fringes generated by interference of imaged data of the digital data as object light with reference light, the digital data, comprising the steps of:

picking up an image of the element hologram as a two-dimensional image;

partially extracting a predetermined region of the picked up two-dimensional image, the predetermined region having stored therein a synchronization signal of data of a form different from that of data produced by performing a predetermined modulation process for the digital data, the digital data being converted into two-dimensional code symbols by dividing the digital data into blocks for each predetermined data amount and performing a predetermined modulation process for the blocks, and the synchronization signal has a data amount equal to that of plural ones of the two-dimensional code symbols;

deciding a tracking state with regard to the element hologram from the extracted two-dimensional image;

fetching the two-dimensional image into a memory where it is decided that the picked up two-dimensional image can be fetched; and performing signal processing for the two-dimensional image stored in the memory to reproduce the digital data.

7. The reproduction method according to claim 6, wherein, where the synchronization signal is extracted in the partially extracted region, it is decided that the picked up two-dimensional image can be fetched.

8. The reproduction method according to claim 6, wherein a plurality of such synchronization signals are recorded on the hologram recording medium, and the two-dimensional image can be fetched when at least one of the plural synchronization signals is reproduced.

9. The reproduction method according to claim 6, wherein the synchronization signal has a form different from that of an adjacent synchronization signal.

10. The reproduction method according to claim 6, further comprising a step of correcting the picked up two-dimensional image, and wherein the picked up two-dimensional image is corrected based on the two-dimensional image in the extracted predetermined region.

11. A reproduction apparatus capable of reproducing, from a hologram recording medium on which digital data are recorded as an element hologram formed from interference fringes generated by interference of imaged data of the digital data as object light with reference light, the digital data, wherein:

an image of the element hologram is picked up as a two-dimensional image;

a predetermined region of the picked up two-dimensional image is partially extracted, the predetermined region having stored therein a synchronization signal of data of a form different from that of data produced by performing a predetermined modulation process for the digital data, the digital data being converted into two-dimensional code symbols by dividing the digital data into blocks for each predetermined data amount and performing a predetermined modulation process for the blocks, and the synchronization signal has a data amount equal to that of plural ones of the two-dimensional code symbols;

a tracking state of the two-dimensional image is decided from data recorded in the predetermined region of the partially extracted two-dimensional image;

the picked up two-dimensional image of the element hologram is fetched into a memory where it is decided from the tracking state of the two-dimensional image that the two-dimensional image can be fetched; and signal processing is performed for the element hologram fetched in the memory to reproduce the digital data.

12. The reproduction apparatus according to claim 11, wherein a synchronization signal is recorded in the predetermined region used to decide the tracking state.

13. A reproduction apparatus capable of reproducing, from a hologram recording medium on which digital data are recorded as an element hologram formed from interference fringes generated by interference of imaged data of the digital data as object light with reference light, the digital data, comprising:

an image pickup section configured to pick up an image of the element hologram as a two-dimensional image;

a storage section configured to store the two-dimensional image picked up by said image pickup section;

a partial extraction section configured to extract a predetermined region of the two-dimensional image picked up by said image pickup section, the predetermined region having stored therein a synchronization signal of data of a form different from that of data produced by performing a predetermined modulation process for the digital data, the digital data being converted into two-dimensional code symbols by dividing the digital data into blocks for each predetermined data amount and performing a predetermined modulation process for the blocks, and the synchronization signal has a data amount equal to that of plural ones of the two-dimensional code symbols;

a decision section configured to decide a tracking state with regard to the element hologram from the two-dimensional image extracted by said partial extraction section;

an image fetching processing section configured to fetch, where it is decided by said decision section that the two-dimensional image picked up by said image pickup section can be fetched, the two-dimensional image picked up by said image pickup section into said storage section;

a signal processing section configured to perform signal processing for the two-dimensional image stored in said storage section to reproduce the digital data; and a control section configured to control said partial extraction section, decision section, image fetching section and signal processing section to extract the predetermined region from the two-dimensional image picked up by said image pickup section, decide the tracking state of the element hologram from the extracted two-dimensional image, fetch the two-dimensional image picked up by said image pickup section into said storage section based on the result of the decision and reproduce the digital data from the two-dimensional image stored in said storage section.

* * * * *